(12) United States Patent
Choi et al.

(10) Patent No.: US 12,219,810 B2
(45) Date of Patent: Feb. 4, 2025

(54) DISPLAY DEVICE WITH PIXEL INCLUDING LIGHT BLOCKING PATTERN ON LIGHT EMITTING ELEMENTS, AND MANUFACTURING METHOD THEREOF

(71) Applicant: Samsung Display Co., LTD., Yongin-si (KR)

(72) Inventors: Jin Woo Choi, Yongin-si (KR); Min Woo Kim, Yongin-si (KR); Sung Kook Park, Yongin-si (KR); Dae Ho Song, Yongin-si (KR); Byung Choon Yang, Yongin-si (KR); Hyung Il Jeon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 533 days.

(21) Appl. No.: 17/521,546

(22) Filed: Nov. 8, 2021

(65) Prior Publication Data
US 2022/0199725 A1 Jun. 23, 2022

(30) Foreign Application Priority Data

Dec. 17, 2020 (KR) .......................... 10-2020-0177878

(51) Int. Cl.
| | |
|---|---|
| *H10K 59/121* | (2023.01) |
| *H10K 50/856* | (2023.01) |
| *H10K 50/86* | (2023.01) |
| *H10K 59/12* | (2023.01) |
| *H10K 71/00* | (2023.01) |

(52) U.S. Cl.
CPC ....... *H10K 59/1213* (2023.02); *H10K 50/856* (2023.02); *H10K 50/865* (2023.02); *H10K 71/00* (2023.02); *H10K 59/1201* (2023.02)

(58) Field of Classification Search
CPC ............... H10K 50/856; H10K 50/865; H10K 59/1213; H10K 71/00
USPC ............................................................ 257/40
See application file for complete search history.

(56) References Cited

U.S. PATENT DOCUMENTS

| | | | |
|---|---|---|---|
| 9,423,832 | B2 | 8/2016 | Jeoung et al. |
| 10,192,858 | B2 | 1/2019 | Higginson et al. |
| 2020/0381474 | A1* | 12/2020 | Choi ..................... H01L 33/505 |

(Continued)

FOREIGN PATENT DOCUMENTS

| | | |
|---|---|---|
| KR | 10-2015-0104462 A | 9/2015 |
| KR | 10-2022-0007828 | 1/2022 |
| KR | 10-2022-0087669 A | 6/2022 |

*Primary Examiner* — Matthew E. Gordon
(74) *Attorney, Agent, or Firm* — Lewis Roca Rothgerber Christie LLP

(57) ABSTRACT

The display device includes a substrate including a plurality of pixel areas; and a pixel in each of the plurality of pixel areas. The pixel may include a pixel circuit layer on the substrate and including at least one transistor; a first electrode on the pixel circuit layer and electrically connected to the transistor; a plurality of light emitting elements on the first electrode and electrically connected to the first electrode; a second electrode on the plurality of light emitting elements; and a light blocking pattern on the second electrode and including a plurality of openings corresponding to each of the plurality of light emitting elements. Here, each of the plurality of pixel areas may include an emission area corresponding to each of the plurality of openings and a non-emission area excluding the emission area.

18 Claims, 27 Drawing Sheets

(56) References Cited

U.S. PATENT DOCUMENTS

2021/0013259 A1\* 1/2021 Ahn .................. H01L 33/56
2022/0013514 A1 1/2022 Choi et al.
2022/0199725 A1 6/2022 Choi et al.

\* cited by examiner

DISPLAY DEVICE WITH PIXEL INCLUDING LIGHT BLOCKING PATTERN ON LIGHT EMITTING ELEMENTS, AND MANUFACTURING METHOD THEREOF

CROSS-REFERENCE TO RELATED APPLICATION

This application claims priority to and the benefit of Korean Patent Application No. 10-2020-0177878 filed in the Korean Intellectual Property Office on Dec. 17, 2020, the entire content of which is incorporated herein by reference.

BACKGROUND

1. Field

The present disclosure relates to a display device and a manufacturing method thereof.

2. Description of the Related Art

With an increasing interest in information displays and an increasing demand for portable information media, the demand and commercialization of display devices have been focused on.

SUMMARY

An aspect of embodiments of the present disclosure is to provide a display device capable of improving the emission efficiency.

Further, an aspect of embodiments of the present disclosure is to provide a method of manufacturing the above-described display device.

A display device according to an embodiment of the present disclosure includes: a substrate including a plurality of pixel areas; and a pixel in each of the plurality of pixel areas. Here, the pixel may include a pixel circuit layer on the substrate and including at least one transistor; a first electrode on the pixel circuit layer and electrically connected to the transistor; a plurality of light emitting elements on the first electrode and electrically connected to the first electrode; a second electrode on the plurality of light emitting elements; and a light blocking pattern on the second electrode and including a plurality of openings corresponding to each of the plurality of light emitting elements.

In an embodiment, each of the plurality of pixel areas may include an emission area corresponding to each of the plurality of openings and a non-emission area excluding the emission area.

In an embodiment, each of the plurality of light emitting elements may have a first end and a second end in a length direction. The first end may be at a lower end of the light emitting element in the length direction, and the second end may be at an upper end of the light emitting element in the length direction.

In an embodiment, each of the plurality of light emitting elements may include a first semiconductor layer electrically connected to the first electrode; a second semiconductor layer contacting the second electrode and electrically connected to the second electrode; and an active layer between the first semiconductor layer and the second semiconductor layer.

In an embodiment, the first semiconductor layer may include a p-type semiconductor layer doped with a p-type dopant, and the second semiconductor layer may include an n-type semiconductor layer doped with an n-type dopant. Here, the first semiconductor layer may be at the first end, and the second semiconductor layer may be at the second end.

In an embodiment, the first end of each of the plurality of light emitting elements and the second end of each of the plurality of light emitting elements may have different sizes in one direction crossing the length direction.

In an embodiment, the second end of each of the plurality of light emitting elements may have a size larger in the one direction than the first end of each of the plurality of light emitting elements.

In an embodiment, each of the plurality of light emitting elements may further include an insulating film surrounding an outer peripheral surface of each of the first semiconductor layer, the active layer, and the second semiconductor layer; and a reflective member surrounding an outer peripheral surface of the insulating film.

In an embodiment, the reflective member may have a height shorter than a length of each of the light emitting elements in the length direction. Here, the reflective member may partially surround the outer peripheral surface of the insulating film and exposes a portion of the insulating film to the outside.

In an embodiment, the light blocking pattern may include a positive photosensitive material and a plurality of light blocking patterns spaced from each other by the plurality of openings.

In an embodiment, the plurality of light blocking patterns between the plurality of openings may have a constant width in the one direction. Alternatively, the plurality of light blocking patterns between the plurality of openings may have a width that increases in the one direction toward the second electrode.

In an embodiment, the display device may further include a plurality of optical patterns within the plurality of openings and corresponding to each of the light emitting elements. The plurality of optical patterns may include a negative transparent photosensitive material.

In an embodiment, the display device may further include a plurality of color conversion patterns within the plurality of openings, corresponding to each of the plurality of light emitting elements, and including color conversion particles. Here, the plurality of color conversion patterns may include a negative photosensitive material. The color conversion particles may be dispersed in the negative photosensitive material.

In an embodiment, the display device may further include a thin film encapsulation layer on the plurality of color conversion patterns.

In an embodiment, the display device may further include a conductive pattern between the first electrode and the first end of each of the plurality of light emitting elements. Here, the conductive pattern may include a bonding metal to reflect light emitted from the plurality of light emitting elements to an upper direction of the plurality of light emitting elements and couples the plurality of light-emitting elements and the first electrode.

A manufacturing method of the display device according to the above-described embodiment includes forming a pixel circuit layer including at least one transistor on a substrate; forming a first electrode electrically connected to the transistor on the pixel circuit layer; coupling a plurality of light emitting elements at one ends to the first electrode; forming a planarization layer exposing an other end of each of the plurality of light emitting elements; forming a second electrode on the exposed other end of each of the plurality of light emitting elements; coating a positive photosensitive material on the second electrode; and forming a light blocking pattern including a plurality of openings corresponding to the plurality of light emitting elements by removing a portion of the positive photosensitive material by using light emitted from the plurality of light emitting elements.

A display device and a manufacturing method thereof according to an embodiment of the present disclosure can form a light blocking pattern including a plurality of openings by removing a portion of a positive photosensitive material by using light emitted from light emitting elements, and arrange optical patterns or color conversion patterns, thereby improving the efficiency of light emitted from the light emitting elements.

In addition, according to the above-described embodiment, by forming a light blocking pattern using light emitting elements as an exposure source, a separate (or external) mask process or alignment process required for exposure can be omitted, thereby simplifying the manufacturing method of the display device and reducing the manufacturing cost.

Additionally, according to the above-described embodiment, by forming structures, for example, optical patterns or color conversion patterns, directly on the light emitting elements by using light emitted from the light emitting elements, the structures can be precisely aligned on the light emitting elements, thereby further improving the efficiency of light emitted from the light emitting elements.

Features and aspects of embodiments of the present disclosure are not limited by what is discussed above, and various additional features and aspects of embodiments of the present disclosure are included in the present specification.

DETAILED DESCRIPTION

Figure 1:
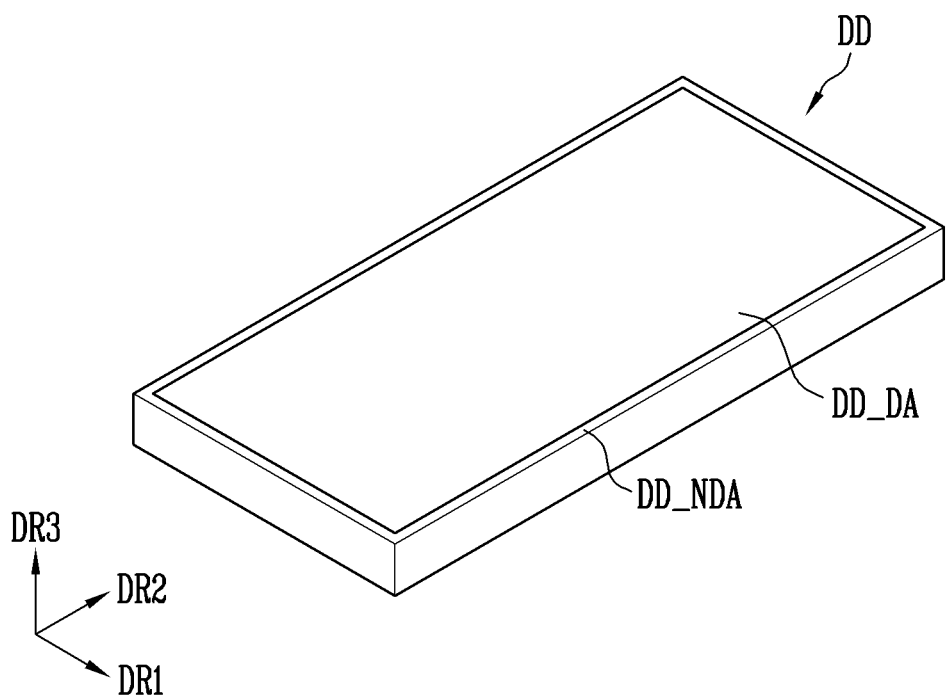
FIG. 1 is a schematic perspective view of a display device according to an embodiment of the present disclosure.

It will be apparent to those skilled in the art that various modifications and variations can be made in the present disclosure without departing from the spirit or scope of the present disclosure, and specific embodiments are illustrated as examples in the drawings and explained in the detailed description. Thus, it is intended that the present disclosure covers the modifications and variations of this disclosure provided they come within the scope of the present disclosure and their equivalents.

Like reference numerals designate like elements throughout the specification. In the accompanying drawings, dimensions of structures are exaggerated for clarity. The terms, 'first', 'second' and the like may be simply used for description of various constituent elements, but those meanings may not be limited to the restricted meanings. The above terms are used only for distinguishing one constituent element from other constituent elements. For example, a first constituent element may be referred to as a second constituent element and similarly, the second constituent element may be referred to as the first constituent element within the scope of the appended claims. When explaining the singular, unless explicitly described to the contrary, it may be interpreted as the plural meaning.

In the specification, the word "comprise" or "has" is used to specify existence of a feature, a numbers, a process, an operation, a constituent element, a part, or a combination thereof, and it will be understood that existence or additional possibility of one or more other features or numbers, processes, operations, constituent elements, parts, or combinations thereof are not excluded in advance. In addition, it will be understood that when an element such as a layer, film, region, or substrate is referred to as being "on" another element, it can be directly on the other element or intervening elements may also be present. In the specification, it will be understood that when an element such as a layer, film, region, or substrate is referred to as being disposed "on" another element, the disposed direction is not limited to an upper direction and include a side direction or a lower direction. In contrast, It will be understood that when an element such as a layer, film, region, or substrate is referred to as being "beneath" another element, it can be directly beneath the other element or intervening elements may also be present.

In the present disclosure, when one component (for example, 'first component') is referred to as being "(operatively or communicatively) coupled with/to" or "connected to" another component (for example, 'second component'), it should be understood that the one component may be directly connected to the another component, or may be connected through another component (for example, 'third component'). On the other hand, when one component (for example, 'first component') is referred to as being "directly coupled" or "directly connected" to another component (for example, 'second component'), it may be understood that no other component (for example, 'third component') exists between the one component and the another component.

Hereinafter, with reference to accompanying drawings, embodiments of the present disclosure and others useful for those skilled in the art to understand the contents of the present disclosure will be described in more detail. In the descriptions below, the terms in singular form may also include plural forms unless only the singular form is clearly intended based on the context in a sentence.

Figure 2:
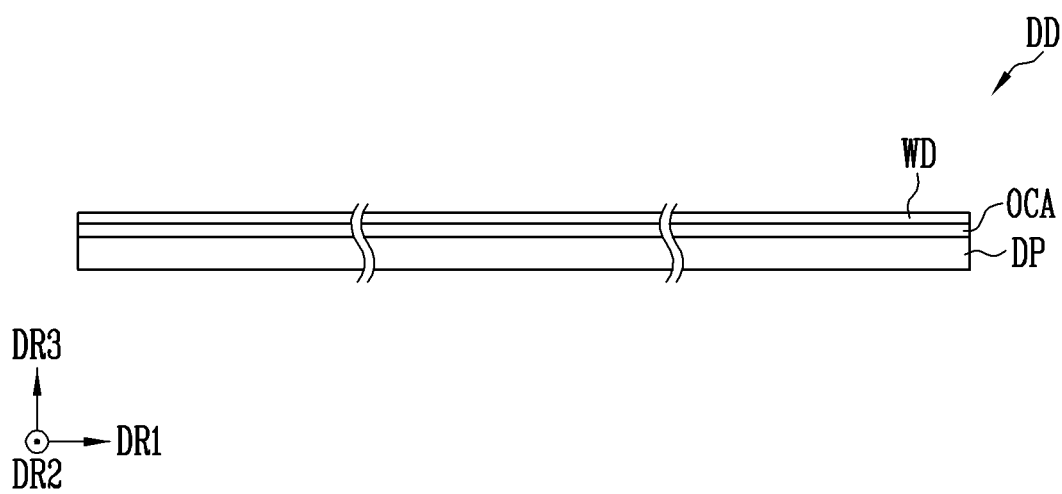
FIG. 2 is a schematic cross-sectional view of the display device of FIG. 1.
Figure 3:
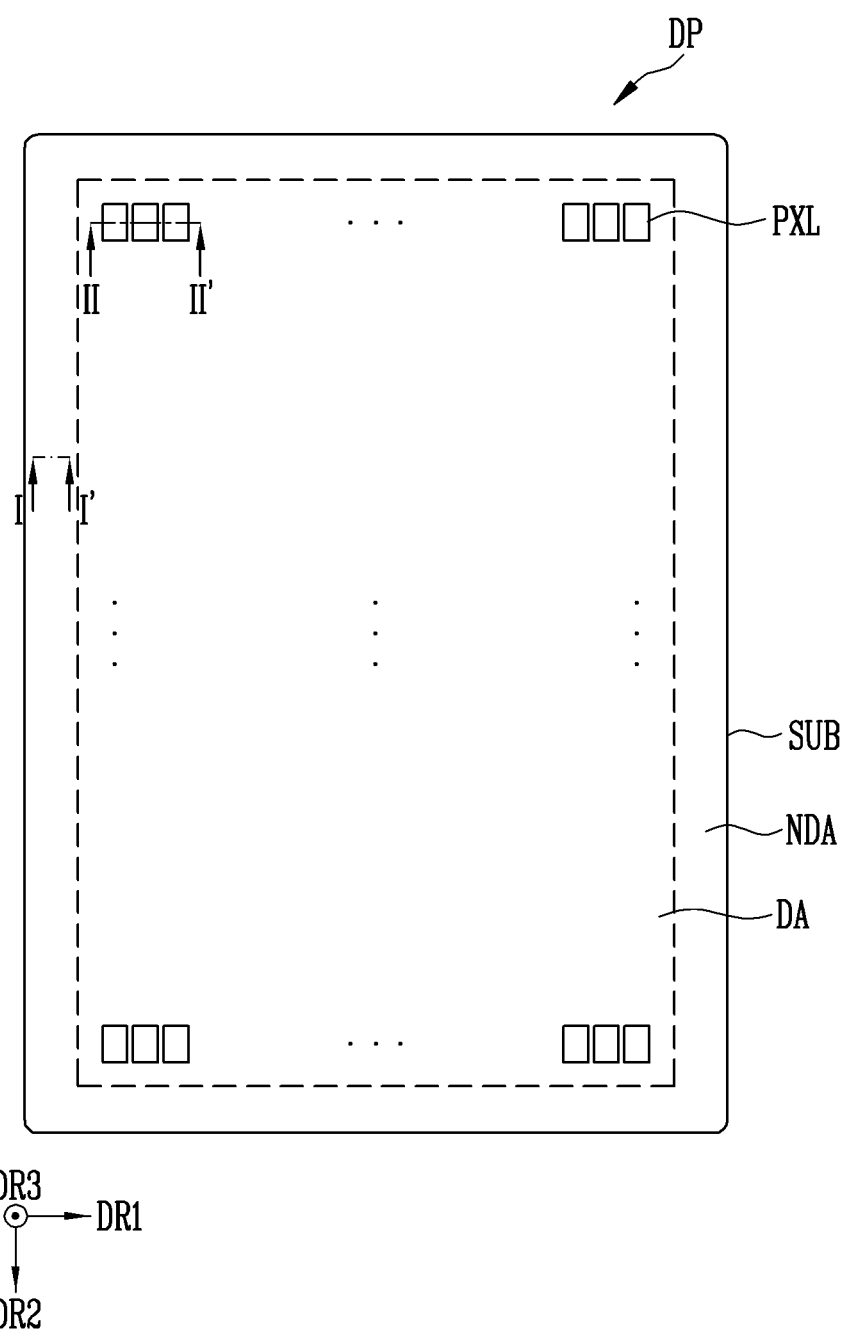
FIG. 3 is a schematic plan view of a display panel according to an embodiment of the present disclosure.
Figure 4:
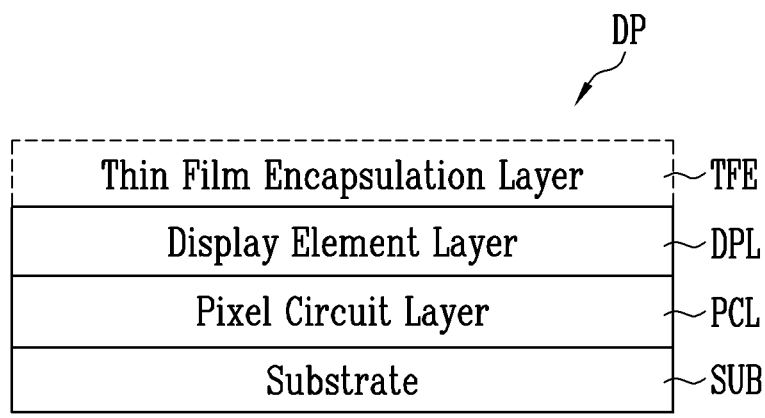
FIG. 4 is a schematic cross-sectional view of a display panel according to an embodiment of the present disclosure.

FIG. 1 is a schematic perspective view of a display device DD according to an embodiment of the present disclosure, FIG. 2 is a schematic cross-sectional view of the display device DD of FIG. 1, FIG. 3 is a schematic plan view of a display panel DP according to an embodiment of the present disclosure, and FIG. 4 is a schematic cross-sectional view of a display panel DP according to an embodiment of the present disclosure.

Referring to FIGS. 1-4, a display device DD may include a display panel DP and a window WD.

The present disclosure may be applied to the display device DD when the display device DD is an electronic device having a display surface formed on at least one surface thereof, such as a smartphone, a television, a tablet PC, a mobile phone, a video phone, an e-book reader, a desktop PC, a laptop PC, a netbook computer, a workstation, a server, a PDA, a portable multimedia player (PMP), an MP3 player, a medical equipment, a camera, a wearable, and the like.

The display device DD may be provided in various shapes, for example, shape of a rectangular plate having two pairs of sides parallel to each other, but the present disclosure is not limited thereto. When the display device DD is provided in a plate of a rectangular shape, one pair of sides of the two pairs of sides may be provided longer than the other pair of sides. In the drawings, the display device DD is illustrated as having a straight edge portion, but the present disclosure is not limited thereto. According to an embodiment, the display device DD provided in a shape of a rectangular plate may have a round shape at an edge portion where one long side and one short side contact.

In an embodiment of the present disclosure, for convenience of description, a case in which the display device DD has a rectangular shape having a pair of long sides and a pair of short sides is shown, and an extension direction of the long sides is referred to as the second direction DR2, an extension direction of the short sides is referred to as the first direction DR1, and a direction (or a vertical direction in a cross-sectional view) perpendicular to the extension directions of the long sides and the short sides is referred to as a third direction DR3. The first to third directions DR1, DR2, and DR3 may refer to directions indicated by the first to third directions DR1, DR2, and DR3, respectively.

In an embodiment of the present disclosure, at least a portion of the display device DD may have flexibility and the display device DD may be folded at the portion having the flexibility.

The display device DD may include a display area DD_DA for displaying an image and a non-display area DD_NDA provided at least one side of the display area DD_DA. The non-display area DD_NDA is an area where the image is not displayed. The present disclosure, however, is not limited thereto. According to an embodiment, a shape of the display area DD_DA and a shape of the non-display area DD_NDA may be relatively designed.

According to the embodiment, the display device DD may include a sensing area and a non-sensing area. The display device DD may not only display an image through the sensing area, but may sense a touch input on a display surface (or an input surface) or sense light incident from the front. The non-sensing area may surround the sensing area along the edge or periphery of the sensing area, but this is an example and the present disclosure is not limited thereto. According to an embodiment, a portion of the display area DD_DA may correspond to the sensing area.

The display panel DP may display an image. The display panel DP may include a display panel capable of self-emission such as an organic light emitting display panel (OLED panel) using an organic light emitting diode (OLED) as a light emitting element, an ultra-small light emitting diode display panel (e.g., a nano-scale LED display panel) using an ultra-small light emitting diode as a light emitting element, and a quantum dot organic light emitting display panel (QD OLED panel) using a quantum dot and an organic light emitting diode (OLED). In addition, the display panel DP may include non-light emitting display panel such as a liquid crystal display panel (LCD panel), an electro-phoretic display panel (EPD panel), and an electro-wetting display panel (EWD panel). When a non-light emitting display panel is used as the display panel DP, the display device DD may include a backlight unit that supplies light to the display panel DP.

The display panel DP may include a substrate SUB and a plurality of pixels PXL provided on the substrate SUB.

The substrate SUB may include one area having a roughly rectangular shape. However, the number of areas provided on the substrate SUB may be different from the above-described embodiment, and the shape of the substrate SUB may be different according to an area provided on the substrate SUB.

The substrate SUB may be made of an insulating material such as glass or resin. In addition, the substrate SUB may be formed of a material having flexibility so as to be bent or folded, and may have a single layer structure or a multilayer structure. For example, the flexible material may include at least one of polystyrene, polyvinyl alcohol, polymethyl methacrylate, polyethersulfone, polyacrylate, polyether imide, polyetherimide, poly ethylene naphthalate, polyethylene terephthalate, polyphenylene sulfide, polyarylate, polyimide, polycarbonate, triacetate cellulose, and cellulose acetate propionate. However, the material constituting the substrate SUB is not limited to the above-described embodiments.

The substrate SUB may include a display area DA and a non-display area NDA surrounding the display area DA along the edge or periphery of the display area DA. The display area DA may be an area in which pixels PXL are provided to display an image, and the non-display area NDA may be an area in which the pixels PXL are not provided and an image is not displayed.

The display area DA of the substrate SUB (or the display panel DP) may correspond to the display area DD_DA of the display device DD, and a non-display area of the substrate SUB (or the display panel DP) NDA may correspond to the non-display area DD_NDA of the display device DD.

A driver for driving the pixels PXL and a portion of lines for connecting the pixels PXL and the driver may be provided on the non-display area NDA. The non-display area NDA may correspond to a bezel area of the display device DD.

The pixels PXL may be provided in the display area DA of the substrate SUB. Each of the pixels PXL may be a minimum unit that displays an image. The pixels PXL may include a light emitting element that emits white light and/or color light. Each of the pixels PXL may emit one of red, green, and blue, but is not limited thereto, and may emit colors such as cyan, magenta, yellow, and the like.

The pixels PXL may be arranged in a matrix form along a row extending in the first direction DR1 and a column extending in the second direction DR2 crossing the first direction DR1. However, an arrangement form of the pixels PXL is not particularly limited, and may be arranged in various forms. In the drawing, the pixels PXL are shown to have a rectangular shape, but the present disclosure is not limited thereto, and may be modified into various shapes. Further, when a plurality of pixels PXL are provided, they may be provided to have different areas (or sizes). For example, in the case of pixels PXL having different colors of emitted light, the pixels PXL may be provided in different areas (or sizes) or in different shapes for each color.

The driver provides a signal to each of the pixels PXL through a line unit, and controls driving of the pixels PXL. In FIG. 3, the line unit is omitted for convenience of description, and the line unit will be described later with reference to FIG. 5.

The display panel DP may include a pixel circuit layer PCL, a display element layer DPL, and a thin film encapsulation layer TFE that are sequentially disposed on the substrate SUB.

The pixel circuit layer PCL may be provided on the substrate SUB, and may include a plurality of transistors and signal lines connected to the transistors. For example, each transistor may have a semiconductor layer, a gate electrode, and a source/drain electrode sequentially stacked with an insulating layer therebetween. The semiconductor layer may include amorphous silicon, poly silicon, low temperature poly silicon, and an organic semiconductor. The gate electrode and the source/drain electrode may include one of aluminum (Al), copper (Cu), titanium (Ti), and molybdenum (Mo), but the present disclosure is not limited thereto. Also, the pixel circuit layer PCL may include at least one insulating layer.

The display element layer DPL may be disposed on the pixel circuit layer PCL. The display element layer DPL may include a light emitting element that emits light. The light emitting element may be, for example, an organic light emitting diode (OLED), but the present disclosure is not limited thereto. According to some embodiments, the light emitting element may be an inorganic light emitting element including an inorganic light emitting material or a light emitting element (e.g., a quantum dot display element) that emits light by changing a wavelength of light emitted using quantum dots.

A thin film encapsulation layer TFE may be selectively disposed on the display element layer DPL. The thin film encapsulation layer TFE may be an encapsulation substrate or may be an encapsulation layer made of a multilayer. When the thin film encapsulation layer TFE is in a form of the encapsulation layer, it may include an inorganic layer and/or an organic layer. For example, the thin film encapsulation layer TFE may be in a form in which an inorganic layer, an organic layer, and an inorganic layer are sequentially stacked. The thin film encapsulation layer TFE may prevent external air and moisture from penetrating into the display element layer DPL and the pixel circuit layer PCL.

The window WD for protecting an exposed surface of the display panel DP may be provided on the display panel DP. The window WD may protect the display panel DP from an external impact and may provide an input surface and/or a display surface to the user. The window WD may be coupled to the display panel DP using an optically transparent adhesive member OCA.

The window WD may have a multi-layer structure selected from a glass substrate, a plastic film, and a plastic substrate. Such a multi-layer structure may be formed by using a continuous process or a bonding process using an adhesive layer. The window WD may have entire or partial flexibility.

A touch sensor may be disposed between the display panel DP and the window WD. The touch sensor may be directly disposed on a surface on which an image is displayed in the display panel DP to receive a user's touch input. In an embodiment of the present disclosure, "directly disposed" may mean that it is formed by a continuous process, and may exclude attaching using a separate adhesive layer. For example, the touch sensor may be integrally formed with the display panel DP according to one or more embodiments of the present disclosure.

Figure 5:
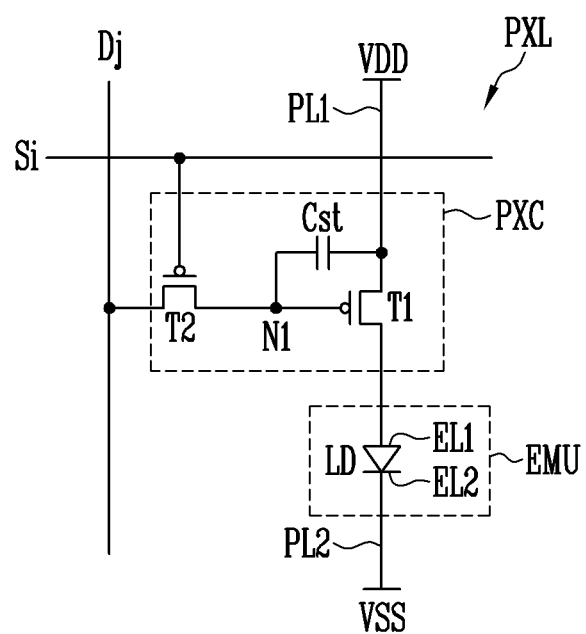
FIG. 5 is a circuit diagram illustrating an electrical connection relationship between constituent elements included in one pixel shown in FIG. 3, according to an embodiment.

FIG. 5 is a circuit diagram illustrating an electrical connection relationship between constituent elements included in one pixel shown in FIG. 3, according to an embodiment.

For example, FIG. 5 illustrates an electrical connection relationship between constituent elements included in a pixel PXL that can be applied to an active display device. However, the type of the constituent elements included in the pixel PXL to which an embodiment of the present disclosure may be applied is not limited thereto.

In FIG. 5, not only the constituent elements included in each of the pixels PXL shown in FIG. 3 but also an area in which the constituent elements are provided is referred to as a pixel PXL. According to an embodiment, the pixel PXL shown in FIG. 5 may be any one of the pixels PXL provided in the display panel DP of FIG. 3, and the pixels PXL may have substantially the same or similar structure to each other.

Referring to FIGS. 3 and 5, one pixel PXL (hereinafter referred to as a 'pixel') may include an emission unit (or an emission part) EMU that generates light having a luminance corresponding to a data signal. In addition, the pixel PXL may selectively further include a pixel circuit PXC for driving the emission unit EMU.

According to an embodiment, the emission unit EMU may include at least one light emitting elements LD connected between a first power line PL1 to which a voltage of a first driving power supply VDD is applied and a second power line PL2 to which a voltage of a second driving power supply VSS is applied. For example, the emission unit EMU may include a first electrode EL1 connected to the first driving power supply VDD through a pixel circuit PXC and the first power line PL1, a second electrode EL2 connected to the second driving power supply VSS through the second power line PL2, and a light emitting element LD connected between the first electrode EL1 and the second electrode EL2. In an embodiment, the first electrode EU may be an anode, and the second electrode EL2 may be a cathode.

In an embodiment, the light emitting element LD included in the emission unit EMU may include one end connected to the first driving power supply VDD and the other end connected to the second driving power supply VSS. According to an embodiment, one end of the light emitting element LD may be provided integrally with the first electrode EL1 to be connected to the first electrode EL1, and the other end of the light emitting element LD may be provided integrally with the second electrode EL2 to be connected to the second electrode EL2. The first driving power supply VDD and the second driving power supply VSS may have different potentials from each other. In this case, a potential difference between the first and second driving power supplies VDD and VSS may be set to be greater than or equal to a threshold voltage of the light emitting element LD during the light emitting period of the pixel PXL.

As described above, the light emitting element LD may constitute an effective light source of the emission unit EMU.

The light emitting element LD may emit light with a luminance corresponding to a driving current supplied through the pixel circuit PXC. For example, during each frame period, the pixel circuit PXC may supply a driving current corresponding to a grayscale value of corresponding frame data to the emission unit EMU. The driving current supplied to the emission unit EMU may flow through the light emitting element LD. Accordingly, while the light emitting element LD emits light with a luminance corresponding to the driving current, the emission unit EMU may emit light.

The pixel circuit PXC may be connected to the scan line Si and the data line Dj of the pixel PXL. For example, when the pixel PXL is disposed at the i-th row (i is a natural number) and the j-th column (j is a natural number) of the display area DA, the pixel circuit PXC of the pixel PXL may be connected to the i-th scan line Si and the j-th data line Dj of the display area DA. According to an embodiment, the pixel circuit PXC may include first and second transistors T1 and T2 and a storage capacitor Cst. However, the structure of the pixel circuit PXC is not limited to the embodiment shown in FIG. 5.

The pixel circuit PXC may include first and second transistors T1 and T2 and a storage capacitor Cst.

A first terminal of the first transistor T1 (e.g., a driving transistor) may be connected to the first driving power supply VDD, and a second terminal thereof may be electrically connected to the light emitting element LD via the first electrode EL1 of the emission unit EMU. A gate electrode of the first transistor T1 may be connected to the first node N1. The first transistor T1 may control an amount of the driving current supplied to the light emitting element LD in response to a voltage of the first node N1.

The first terminal of the second transistor T2 (e.g., a switching transistor) may be connected to the j-th data line Dj, and the second terminal thereof may be connected to the first node N1. Here, the first terminal and the second terminal of the second transistor T2 may be different terminals. For example, when the first terminal of the second transistor T2 is a source electrode, the second terminal of the second transistor T2 may be a drain electrode. A gate electrode of the second transistor T2 may be connected to the i-th scan line Si.

The second transistor T2 may be turned on when a scan signal of a gate on voltage (e.g., a low voltage) at which the second transistor T2 may be turned on is supplied from the i-th scan line Si to electrically connect the j-th data line Dj and the first node N1. At this time, a data signal of the corresponding frame is supplied to the j-th data line Dj, and accordingly, the data signal is transferred to the first node N1. The data signal transferred to the first node N1 is charged to the storage capacitor Cst. For example, the capacitor Cst may hold a charge corresponding to the data signal that is transferred to the first node N1.

One electrode of the storage capacitor Cst may be connected to the first driving power supply VDD, and the other electrode of the storage capacitor Cst may be connected to the first node N1. The storage capacitor Cst may charge the voltage (or hold a charge) corresponding to the data signal supplied to the first node N1, and maintain the charged voltage until the data signal of the next frame is supplied.

In FIG. 5, the pixel circuit PXC is shown including the second transistor T2 for transferring a data signal into the pixel PXL, a storage capacitor Cst for storing the data signal, and the first transistor T1 for transferring a driving current corresponding to the data signal to the light emitting element LD.

However, the present disclosure is not limited thereto, and the structure of the pixel circuit PXC may be variously changed. For example, the pixel circuit PXC may further include at least one transistor element such as a transistor element for compensating for the threshold voltage of the first transistor T1, a transistor element for initializing the first node N1, and/or a transistor element for controlling the light emitting time of the light emitting element LD, and the like, or other circuit elements such as a boosting capacitor for boosting a voltage of the first node N1, and the like.

Figure 6A:
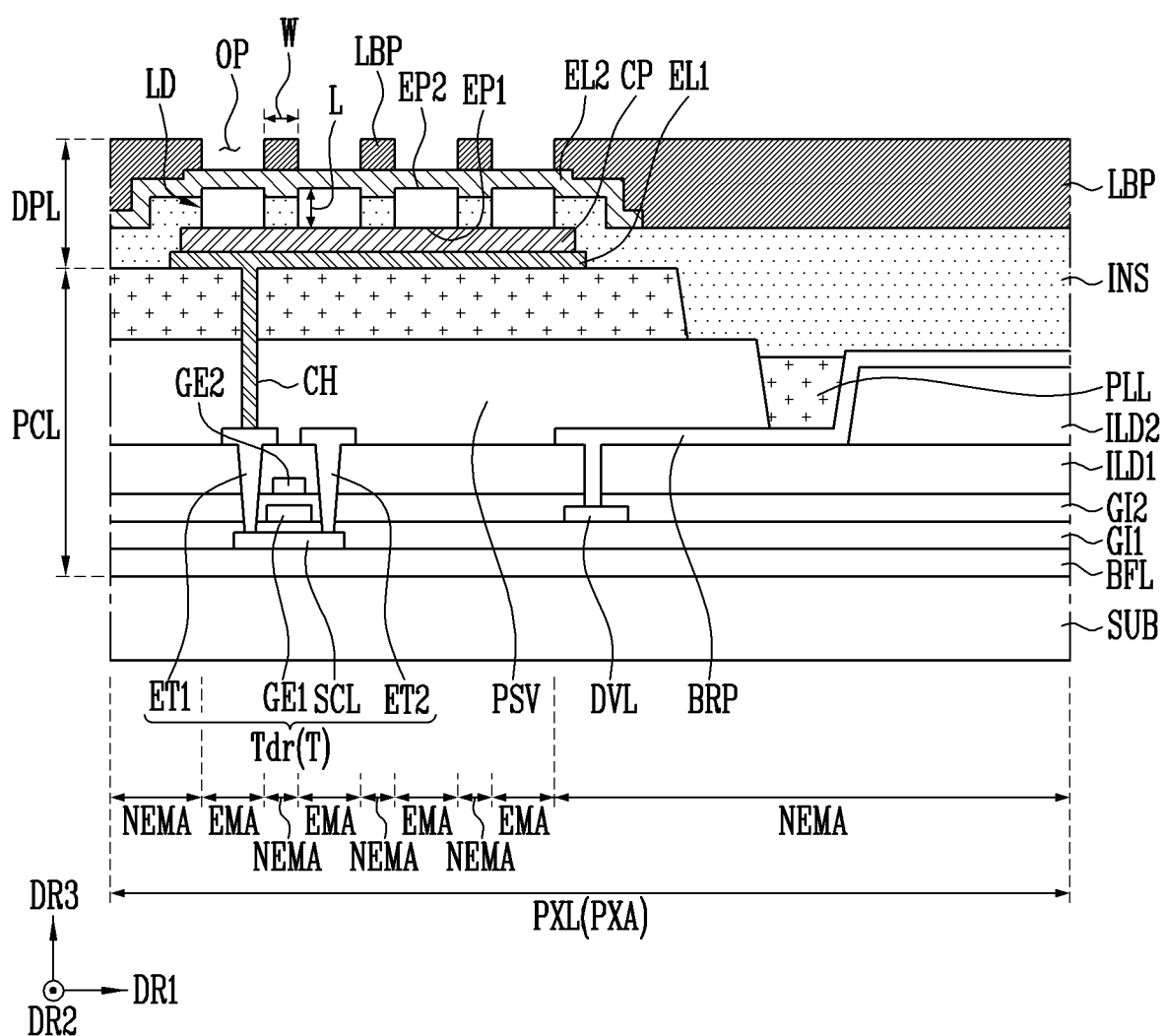
FIG. 6A is a schematic cross-sectional view illustrating a pixel according to an embodiment of the present disclosure and illustrating a connection structure between a first transistor and a light-emitting element shown in FIG. 5.
Figure 6B:
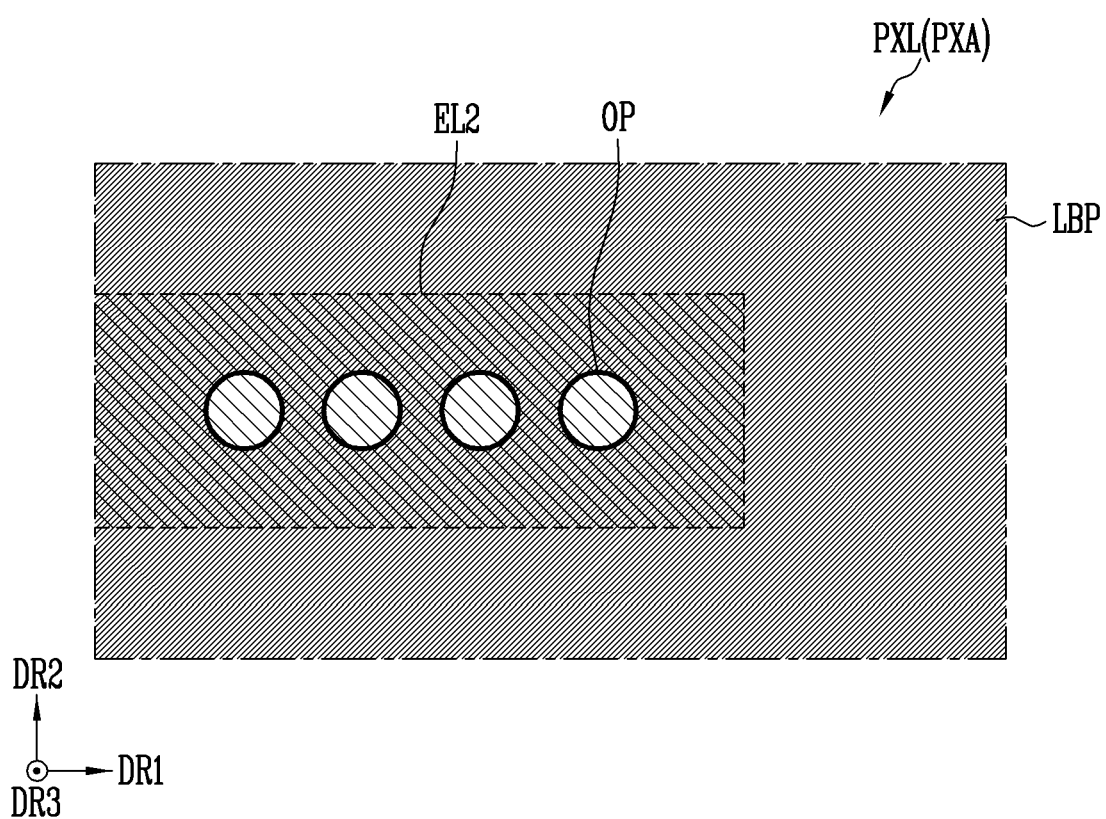
FIG. 6B is a schematic plan view of a pixel viewed from above based on the light blocking pattern and the second electrode of FIG. 6A.
Figure 6C:
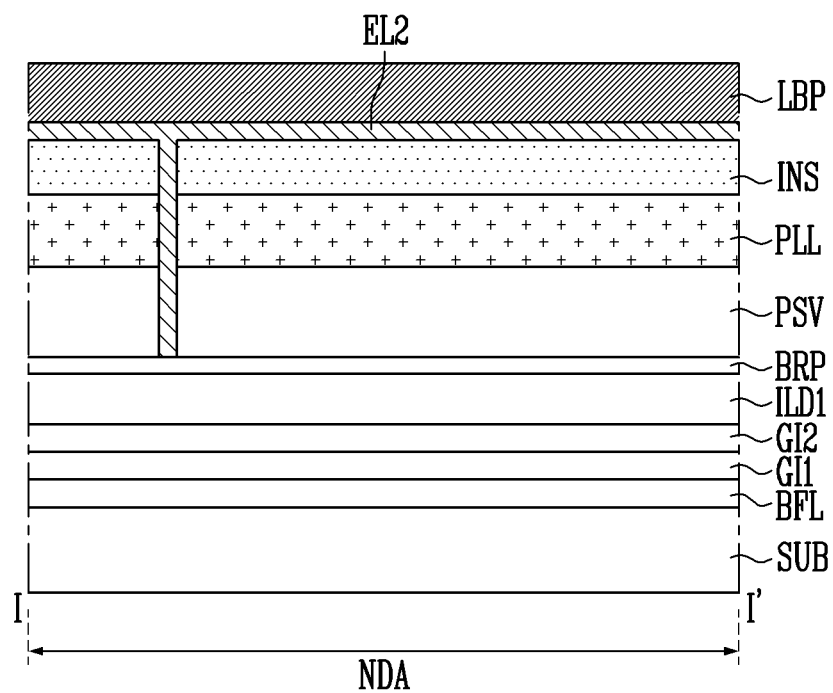
FIG. 6C is a cross-sectional view taken along the line I-I' of FIG. 3.
Figure 7:
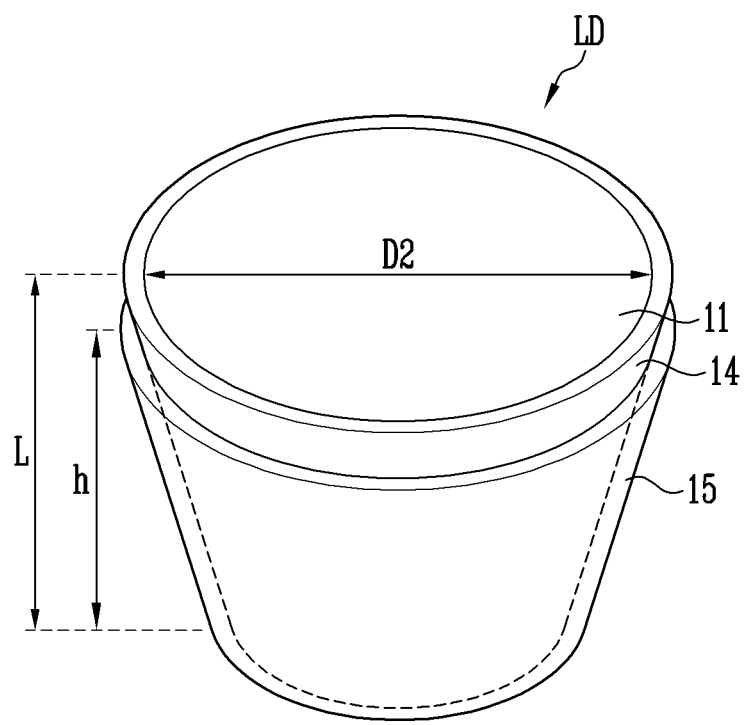
FIG. 7 is a perspective view schematically illustrating one light-emitting element of the light-emitting elements of FIG. 6A.
Figure 8:
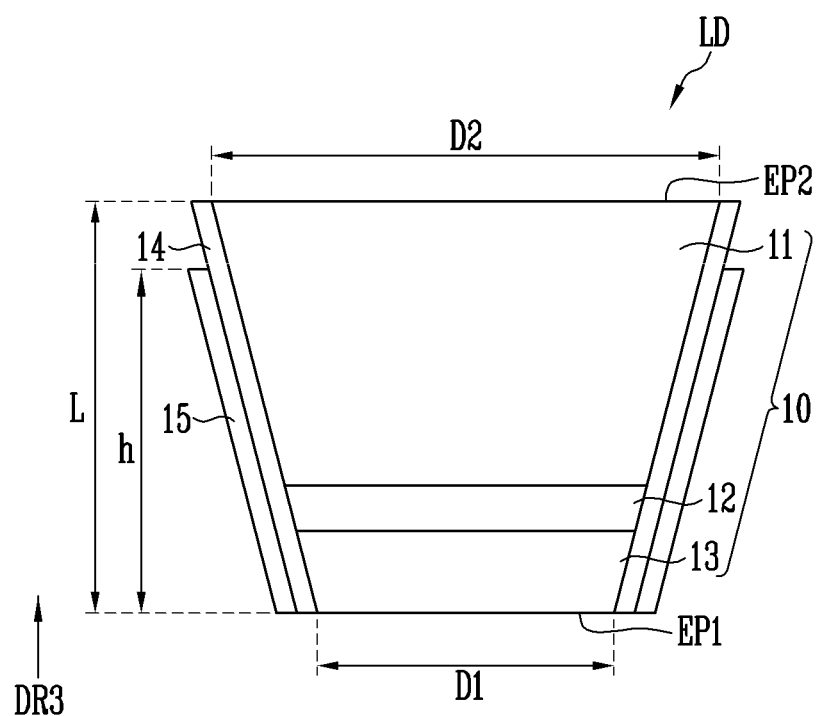
FIG. 8 is a cross-sectional view of the light-emitting element of FIG. 7.
Figure 9:
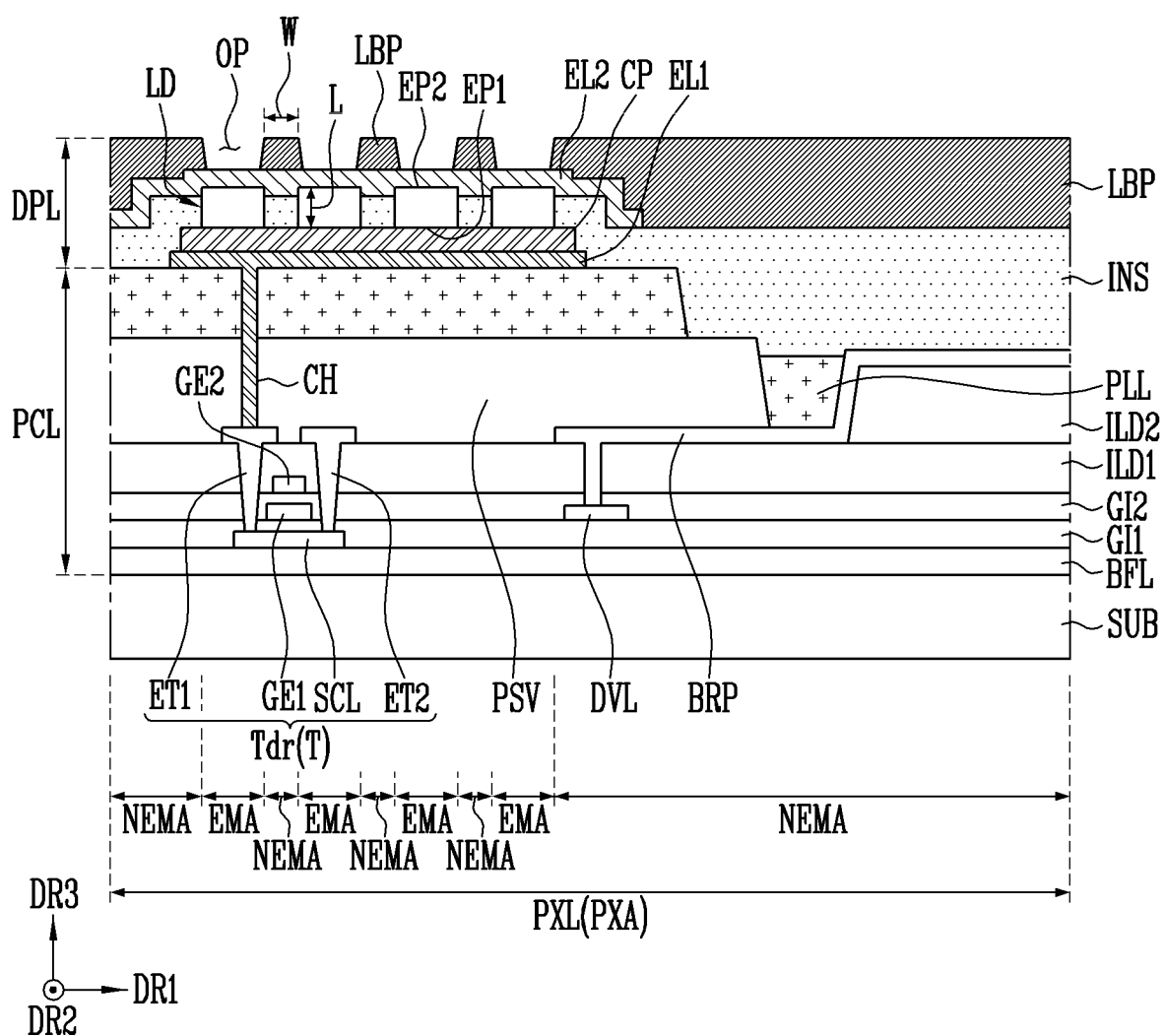
FIG. 9 is a schematic cross-sectional view illustrating a light blocking pattern in the pixel of FIG. 6A according to another embodiment.

FIG. 6A is a schematic cross-sectional view illustrating a pixel PXL according to an embodiment of the present disclosure and illustrating a connection structure between the first transistor T1 and the light emitting element LD shown in FIG. 5, FIG. 6B is a schematic plan view of a pixel PXL viewed from above based on the light blocking pattern LBP and the second electrode EL2 of FIG. 6A, FIG. 6C is a cross-sectional view taken along the line I-I' of FIG. 3, FIG. 7 is a perspective view schematically illustrating one light emitting element LD of the light emitting elements LD of FIG. 6A, FIG. 8 is a cross-sectional view of the light emitting element LD of FIG. 7, and FIG. 9 is a schematic cross-sectional view illustrating the light blocking pattern LBP in the pixel PXL of FIG. 6A according to another embodiment.

In an embodiment of the present disclosure, for convenience of description, a direction parallel to the main surface of the substrate SUB in the cross-sectional view is referred to as the first direction DR1, a direction parallel to a direction of a length L of the light emitting elements LD in the cross-sectional view (or a thickness direction of the substrate SUB) is referred to as the third direction DR3, and a direction (or a vertical direction in a plan view) perpendicular to the first and third directions DR1 and DR3 is referred to as the second direction DR2. The first to third directions DR1, DR2, and DR3 may refer to directions indicated by the first to third directions DR1, DR2, and DR3, respectively.

In FIGS. 6A, 6C, and 9, one pixel PXL is shown to be simplified, such as showing each electrode as an electrode of a single layer, showing each insulating layer as an insulating layer of a single layer, and the like, but the present disclosure is not limited thereto.

Referring to FIGS. 6A-9, the pixel PXL according to an embodiment may be disposed in each pixel area PXA provided in the display area DA of the substrate SUB. The above-described pixel PXL may include the substrate SUB, the pixel circuit layer PCL, and the display element layer DPL.

Because the substrate SUB has the same configuration as the substrate SUB described with reference to FIG. 3, a detailed description thereof will be omitted.

A plurality of insulating layers and a plurality of conductive layers may be disposed on the substrate SUB. The insulating layers may include, for example, a buffer layer BFL, first and second gate insulating layers GI1 and GI2, the first and second interlayer insulating layers ILD1 and ILD2, a protective layer PSV, a planarization layer PLL, and an insulating layer INS sequentially provided on the substrate SUB. The conductive layers may include, for example, a first conductive layer provided on the first gate insulating layer GI1, a second conductive layer provided on the second gate insulating layer GI2, a third conductive layer provided on the first and second interlayer insulating layers ILD1 and ILD2, a fourth conductive layer provided on the planarization layer PLL, and a fifth conductive layer provided on the insulating layer INS. However, the insulating layers and conductive layers provided on the substrate SUB are not limited to the above-described embodiments, and according to some embodiments, other insulating layers and other conductive layers in addition to the insulating layers and conductive layers may be provided.

The pixel circuit layer PCL may include the buffer layer BFL, the pixel circuit provided on the buffer layer BFL (refer to PXC in FIG. 5), the protective layer PSV, and the planarization layer PLL.

The buffer layer BFL may be provided and/or formed on one surface of the substrate SUB. The buffer layer BFL may prevent impurities from diffusing into the transistor T included in the pixel circuit PXC. The buffer layer BFL may include an inorganic insulating layer including an inorganic material. The buffer layer BFL may include at least one of metal oxides such as silicon nitride (SiNx), silicon oxide (SiOx), silicon oxynitride (SiOxNy), aluminum oxide (AlOx), and the like. The buffer layer BFL may be provided as a single layer, but may also be provided as a multiple layer having at least a double layer. When the buffer layer BFL is provided as multilayers, each of the multilayers may be formed of the same material or different materials. The buffer layer BFL may be omitted depending on materials and process conditions of the substrate SUB.

The transistor T may include a driving transistor Tdr that controls the driving current of the light emitting elements LD and a switching transistor electrically connected to the driving transistor Tdr. However, the present disclosure is not limited thereto, and the pixel circuit PXC may further include circuit elements that perform other functions in addition to the driving transistor Tdr and the switching transistor. The driving transistor Tdr may be the first transistor T1 described with reference to FIG. 5, and the switching transistor may be the second transistor T2 described with reference to FIG. 5. In the following embodiments, when the driving transistor Tdr and the switching transistor are collectively named, they are referred to as transistors T or transistors T.

The transistor T may include a semiconductor pattern SCL, a first gate electrode GE1, a first terminal ET1, and a second terminal ET2. The first terminal ET1 may be one of a source electrode and a drain electrode, and the second terminal ET2 may be the other one of the source electrode and the drain electrode. For example, the first terminal ET1 may be a source electrode, and the second terminal ET2 may be a drain electrode.

The semiconductor pattern SCL may be provided and/or formed on the buffer layer BFL. The semiconductor pattern SCL may include a first contact area contacting the first terminal ET1 and a second contact area contacting the second terminal ET2. A region between the first contact region and the second contact region may be a channel region. This channel region may overlap the first gate electrode GE1 of the corresponding transistor T in the third direction DR3. The semiconductor pattern SCL may be made of poly silicon, amorphous silicon, an oxide semiconductor, or the like. The channel region may be, for example, a semiconductor pattern that is not doped with impurities, and may be an intrinsic semiconductor. The first contact region and the second contact region may be semiconductor patterns doped with impurities.

The first gate insulating layer GI1 may be provided on the semiconductor pattern SCL and the buffer layer BFL. The first gate electrode GE1 may be provided and/or formed on the first gate insulating layer GI1 to correspond to the channel region of the semiconductor pattern SCL. The first gate electrode GE1 may be provided on the first gate insulating layer GI1 and may overlap the channel region of the semiconductor pattern SCL in the third direction DR3. In an embodiment, the first gate electrode GE1 may be a first conductive layer. The first gate electrode GE1 may be formed in a single layer structure made of a single material selected from the group consisting of copper (Cu), molybdenum (Mo), tungsten (W), aluminum neodymium (AlNd), titanium (Ti), aluminum (Al), silver (Ag), and alloys thereof, or a mixture thereof, or may be formed in a double-layer or multilayer structure made of low-resistance materials such as molybdenum (Mo), titanium (Ti), copper (Cu), aluminum (Al), or silver (Ag) to reduce line resistance.

The first gate insulating layer GI1 may be an inorganic insulating layer including an inorganic material. For example, the first gate insulating layer GI1 may include at least one of metal oxides such as silicon nitride (SiNx), silicon oxide (SiOx), silicon oxynitride (SiOxNy), aluminum oxide (AlOx), and the like. However, the material of the first gate insulating layer GI1 is not limited to the above-described embodiments. According to an embodiment, the first gate insulating layer GI1 may be formed of an organic insulating layer including an organic material. The first gate insulating layer GI1 may be provided as a single layer, but may be provided as multilayers that are at least double layers. The second gate insulating layer GI2, the first interlayer insulating layer ILD1, and the second interlayer insulating layer ILD2 may be sequentially disposed on the first gate insulating layer GI1 and the first gate electrode GE1 of the transistor T.

The first terminal ET1 and the second terminal ET2 may be provided and/or formed on the first interlayer insulating layer ILD1, and may contact a first contact area and a second contact area of the semiconductor pattern SCL through corresponding contact holes sequentially penetrating the first and second gate insulating layers GI1 and GI2 and the first interlayer insulating layer ILD1, respectively. For example, the first terminal ET1 may contact the first contact area of the semiconductor pattern SCL, and the second terminal ET2 may contact the second contact area of the semiconductor pattern SCL. Each of the first and second terminals ET1 and ET2 may include the same material as the first gate electrode GE1 or at least one material selected from materials discussed, for example, as the constituent materials of the first gate electrode GE1. In an embodiment, the first terminal ET1 and the second terminal ET2 described above may be a third conductive layer provided and/or formed on the substrate SUB.

The first interlayer insulating layer ILD1 may include the same material as the first gate insulating layer GI1 or may include at least one material selected from materials discussed, for example, as constituent materials of the first gate insulating layer GI1.

In the above-described embodiment, the first and second terminals ET1 and ET2 of the transistor T are described as a separate electrode electrically connected to the semiconductor pattern SCL through corresponding contact holes sequentially penetrating the first and second gate insulating layers GI1 and GI2 and the first interlayer insulating layer ILD1, however, the present disclosure is not limited thereto. According to an embodiment, the first terminal ET1 of the transistor T may be a first contact region adjacent to the channel region of the corresponding semiconductor pattern SCL, and the second terminal ET2 of the transistor T may be a second contact region adjacent to the channel region of the corresponding semiconductor pattern SCL. In this case, the first terminal ET1 of the transistor T may be electrically connected to the light emitting elements LD of the corresponding pixel PXL through a separate connection means such as a bridge electrode, and the like.

In an embodiment, the transistors T may be formed of a low-temperature polysilicon thin film transistor, but the present disclosure is not limited thereto. According to an embodiment, the transistors T may be formed of oxide semiconductor thin film transistors. Further, in the above-described embodiment, a case where the transistors T are thin film transistors having a top gate structure is described as an embodiment, but the present disclosure is not limited thereto, and the structure of the transistors T may be variously changed.

Further, the pixel circuit layer PCL may further include a driving voltage line DVL on the first gate insulating layer GI1, a second gate electrode GE2 on the second gate insulating layer GI2 and overlapping the first gate electrode GE1 of the transistor T in the third direction DR3, and a bridge pattern BRP on the first interlayer insulating layer ILD1 and the second interlayer insulating layer ILD2.

The driving voltage line DVL may receive a suitable signal (e.g., a set or predetermined signal) (or voltage) from an external power supply. For example, the driving voltage line DVL may be the second power line PL2 described with reference to FIG. 5, and the voltage of the second driving power supply VSS (refer to FIG. 5) may be applied to the driving voltage line DVL from an external power supply. The driving voltage line DVL may be electrically connected to a portion of the display element layer DPL through the bridge pattern BRP. For example, the driving voltage line DVL may be electrically connected to the second electrode EL2 provided in the display element layer DPL through the bridge pattern BRP. Accordingly, the voltage of the second driving power supply VSS applied through the driving voltage line DVL may be applied to the second electrode EL2.

The driving voltage line DVL may be provided and/or formed on the first gate insulating layer GI1. In an embodiment, the driving voltage line DVL may be a first conductive layer, may be disposed on the same layer as the first gate electrode GE1, may include the same material thereas, and may be formed through the same process thereas. However, the present disclosure is not limited thereto, and the driving voltage line DVL may be provided at the same layer as any one of conductive layers provided in the pixel circuit layer PCL according to an embodiment. That is, the position of the driving voltage line DVL in the pixel circuit layer PCL may be variously changed.

The bridge pattern BRP may be provided and/or formed over the first and second interlayer insulating layers ILD1 and ILD2. However, the present disclosure is not limited thereto, and according to an embodiment, when the second interlayer insulating layer ILD2 is omitted, the bridge pattern BRP may be provided and/or formed only on the first interlayer insulating layer ILD1. The bridge pattern BRP may be electrically connected to the driving voltage line DVL through a contact hole sequentially passing through the first interlayer insulating layer ILD1 and the second gate insulating layer GI2. As shown in FIG. 6C, the bridge pattern BRP may be electrically connected to the second electrode EL2 of the display element layer DPL in the non-display area NDA. For example, in the non-display area NDA, the bridge pattern BRP may be electrically connected to the second electrode EL2 disposed on the insulating layer INS through a contact hole sequentially passing through the protective layer PSV, the planarization layer PLL, and the insulating layer INS. In an embodiment, the bridge pattern BRP may be an intermediate medium electrically connecting the second electrode EL2 of the display element layer DPL and the driving voltage line DVL of the pixel circuit layer PCL. According to an embodiment, the bridge pattern BRP may be omitted. In this case, the driving voltage line DVL may electrically contact the second electrode EL2 of the display element layer DPL via the bridge pattern BRP, and the voltage of the second driving power supply VSS applied to the driving voltage line DVL may be directly transferred to the second electrode EL2.

The bridge pattern BRP may include a conductive material (or a suitable material). For example, the bridge pattern BRP may be formed in a single layer structure made of a single material selected from the group consisting of copper (Cu), molybdenum (Mo), tungsten (W), aluminum neodymium (AlNd), titanium (Ti), aluminum (Al), silver (Ag), and alloys thereof, or a mixture thereof, or may be formed in a double-layer or multilayer structure made of low-resistance materials such as molybdenum (Mo), titanium (Ti), copper (Cu), aluminum (Al), or silver (Ag) to reduce line resistance. is made of copper (Cu), molybdenum (Mo), tungsten (W), aluminum neodymium (AlNd), titanium (Ti), aluminum (Al), silver (Ag), and alloys thereof. In order to form a single film with a single film selected from the group or a mixture thereof, or a double film of low-resistance materials such as molybdenum (Mo), titanium (Ti), copper (Cu), aluminum (Al), or silver (Ag), or it can be formed in a multi-layer structure.

At least a part of the bridge pattern BRP may be provided at the same layer as the first and second terminals ET1 and ET2 of the transistor T, may include the same material thereas, and may be formed through the same process thereas, but the present disclosure is limited thereto.

The second interlayer insulating layer ILD2 may be partially provided and/or formed on the first interlayer insulating layer ILD1, and may be omitted according to an embodiment. The second interlayer insulating layer ILD2 may be formed of an inorganic insulating layer including an inorganic material or an organic insulating layer including an organic material.

The second gate electrode GE2 may be provided and/or formed on the second gate insulating layer GI2 and may overlap the first gate electrode GE1 in the third direction DR3. In an embodiment, the second gate electrode GE2 may be a second conductive layer disposed between the first conductive layer and the third conductive layer. The second gate electrode GE2 may be a gate electrode, a power line, or a signal line of another transistor, or may form a capacitor with another electrode. The second gate electrode GE2 may include the same material as the first gate electrode GE1 or may include at least one material selected from materials discussed, for example, as constituent materials of the first gate electrode GE1.

The second gate insulating layer GI2 may include the same material as the first gate insulating layer GI1 or may include at least one material selected from materials discussed, for example, as constituent materials of the first gate insulating layer GI1.

A protective layer PSV may be provided and/or formed on the transistor T and the bridge pattern BRP. For example, the protective layer PSV may be provided and/or formed on at least a part of the first interlayer insulating layer ILD1 and at least a part of the bridge pattern BRP.

The protective layer PSV may be provided in a form including an organic insulating layer, an inorganic insulating layer, or an organic insulating layer disposed on the inorganic insulating layer. For example, the inorganic insulating layer may include at least one of metal oxides such as silicon oxide (SiOx), silicon nitride (SiNx), silicon oxynitride (SiOxNy), and aluminum oxide (AlOx). For example, the organic insulating layer may include at least one selected from the group consisting of polyacrylates resin, epoxy resin, phenolic resin, polyamides resin, polyimide resin, unsaturated polyester resin, poly-phenylen ethers resin, poly-phenylene sulfides resin, and benzocyclobutene resin.

In an embodiment, the protective layer PSV may have a contact hole CH exposing the first terminal ET1 of the driving transistor Tdr to the outside and may be partially opened to expose a portion of the bridge pattern BRP.

A planarization layer PLL may be provided and/or formed on the protective layer PSV and the exposed portion of the bridge pattern BRP between the protective layer PSV and the second interlayer insulating layer ILD2 in the first direction DR1.

The planarization layer PLL may alleviate a step difference due to constituent element disposed under the planarization layer PLL. To this end, the planarization layer PLL may be formed of an organic insulating layer including an organic material. In this case, the planarization layer PLL may include the same material as the protective layer PSV or may include at least material selected from materials discussed, for example, as constituent materials of the protective layer PSV. The planarization layer PLL may include a contact hole CH corresponding to the contact hole CH of the protective layer PSV exposing the first terminal ET1 of the driving transistor Tdr to the outside. According to the described embodiment, the planarization layer PLL may be omitted.

The display element layer DPL may be provided on the planarization layer PLL.

The display element layer DPL may include a first electrode EL1, a plurality of light emitting elements LD, an insulating layer INS, and a second electrode EL2.

The first electrode EL1 may be provided and/or formed on the pixel circuit layer PCL. The first electrode EU may be electrically connected to the first end EP1 of each of the light emitting elements LD. The second electrode EL2 may be provided on the light emitting elements LD, and may be electrically connected to the second end EP2 of each of the light emitting elements LD. When viewed in cross section, the first electrode EU and the second electrode EL2 may face each other with the light emitting elements LD interposed therebetween.

The first electrode EL1 may be electrically connected to the first terminal ET1 of the driving transistor Tdr through the contact hole CH sequentially penetrating the protective layer PSV and the planarization layer PLL. In an embodiment, the first electrode EL1 may be an anode. The first electrode EL1 may be the first electrode EL1 described with reference to FIG. 5.

The first electrode EL1 may be formed of a material having a desired reflectivity (e.g., a set or predetermined reflectivity) so that the light emitted from each of the light emitting elements LD may propagate in an image display direction (e.g., a front direction) of a display device (e.g., DD in FIG. 1). For example, the first electrode EL1 may be made of a conductive material (or substance) having a desired reflectivity (e.g., a set or predetermined reflectivity). The conductive material (or substance) may include an opaque metal that is suitable for reflecting light emitted from the light emitting elements LD to the image display direction (or a desired direction) of the display device DD. The opaque metal may include, for example, metals such as silver (Ag), magnesium (Mg), aluminum (Al), platinum (Pt), palladium (Pd), gold (Au), nickel (Ni), neodymium (Nd), iridium (Ir), chromium (Cr), titanium (Ti), and alloys thereof. According to an embodiment, the first electrode EL1 may include a transparent conductive material (or substance). The transparent conductive material (or substance) may include a conductive oxide such as indium tin oxide (ITO), indium zinc oxide (IZO), zinc oxide (ZnO), indium gallium zinc oxide (IGZO), and indium tin zinc oxide (ITZO), and a conductive polymer such as poly(3,4-ethylenedioxythiophene) (PEDOT). When the first electrode EU includes a transparent conductive material (or substance), a separate conductive layer that is made of an opaque metal for reflecting light emitted from each of the light emitting elements LD to the image display direction of the display device DD, may be added. However, the material of the first electrode EL1 is not limited to the above-described materials.

The first electrode EL1 may be provided and/or formed as a single layer, but the present disclosure is not limited thereto. According to the described embodiment, the first electrode EL1 may be provided and/or formed as a multilayer in which at least two materials of metals, alloys, conductive oxides, and conductive polymers are stacked. The first electrode EU may be formed of a multilayer that is at least a double layer to reduce or minimize distortion due to signal delay when transferring a signal (or voltage) to the first end EP1 of each of the light emitting elements LD. For example, the first electrode EL1 may be formed as a multilayer sequentially stacked in the order of indium tin oxide (ITO)/silver (Ag)/indium tin oxide (ITO). In an embodiment, the first electrode EU may be a fourth conductive layer.

The light emitting elements LD may be provided on the first electrode EU.

The light emitting elements LD may be provided on the first electrode EU in a bonding state with the conductive pattern CP. For example, the conductive pattern CP may be disposed between the first electrode EU and the light emitting elements LD. Each of the light emitting elements LD may include the first semiconductor layer 11, the second semiconductor layer 13, and the active layer 12 disposed between the first and second semiconductor layers 11 and 13, as shown in FIGS. 7 and 8. For example, each of the light emitting elements LD may implement a light emitting stack 10 in which the second semiconductor layer 13, the active layer 12, and the first semiconductor layer 11 are sequentially stacked in the third direction DR3.

Each of the light emitting elements LD may be provided in a shape extending in one direction (e.g., the third direction DR3). When an extending direction of each of the light emitting elements LD is a direction of the length L, each light emitting element LD may include the first end EP1 (or lower end) and the second end EP2 (or upper end). In one embodiment, the direction of the length L may be parallel to the third direction DR3. One of the first semiconductor layer 11 and the second semiconductor layer 13 may be disposed on the first end EP1 (or a lower end) of each light emitting element LD, and the other one of the first semiconductor layer 11 and the second semiconductor layer 13 may be disposed on the second end EP2 (or an upper end) of each of the light emitting elements LD. For example, the second semiconductor layer 13 may be disposed on the first end EP1 (or the lower end) of each light emitting element LD, and the first semiconductor layer 11 may be disposed on the second end EP2 (or the upper end).

Each light emitting element LD may be provided in various shapes. For example, each light emitting element LD may have a rod-like shape, a bar-like shape, or a column shape that is long in the direction of the length L (i.e., with an aspect ratio is greater than 1). For another example, each light emitting element LD may have a rod-like shape, a bar-like shape, or a column shape that is short in the direction of the length L (i.e., with an aspect ratio is less than 1). For another example, each light emitting element LD may have a rod-like shape, a bar-like shape, or a column shape with an aspect ratio of 1.

In an embodiment, each light emitting element LD may have a column shape in which a diameter D1 of the first end EP1 and a diameter D2 of the second end EP2 are different from each other. For example, each light emitting element LD may have a column shape in which the diameter D1 of the first end EP1 is smaller than the diameter D2 of the second end EP2. For example, each light emitting element LD may have an elliptical column shape in which a diameter increases as it goes upward in the direction of the length L (or the third direction DR3).

The length L of each light emitting element LD in the direction of the length L may be larger or smaller than the diameter D1 (or width of the first cross-section) of the first end EP1 and the diameter D2 (or width of the second cross-section) of the second end EP2. For example, the length L of each light emitting element LD may be greater than the diameter D1 of the first end EP1 and smaller than the diameter D2 of the second end EP2. However, the present disclosure is not limited thereto, and the length L of each light emitting element LD may be the same as the diameter D1 of the first end EP1 or the diameter D2 of the second end EP2 according to the described embodiment. Each of the above-described light emitting elements LD may include, for example, a light emitting diode (LED) manufactured in an ultra-small size to have a diameter and/or a length L of about a nano scale to a micro scale.

The size of each light emitting element LD may be variously changed to meet the requirements (or design conditions) of a lighting device or a self-luminous display device to which each light emitting element LD is applied.

The second semiconductor layer 13 may include at least one p-type semiconductor layer. For example, the second semiconductor layer 13 may include at least one semiconductor material of InAlGaN, GaN, AlGaN, InGaN, AlN, InN, and may include a p-type semiconductor layer doped with a second conductive dopant (or p-type dopant) such as Mg, Zn, Ca, Sr, Ba, etc. However, the material constituting the second semiconductor layer 13 is not limited thereto, and various other materials may constitute the second semiconductor layer 13. The second semiconductor layer 13 may include an upper surface in contact with the active layer 12 and a lower surface exposed to the outside in the direction of the length L of each light emitting element LD at the first end EP1 of the light emitting element LD.

The active layer 12 may be disposed on the second semiconductor layer 13, and may be formed in a single or multiple quantum well structure. For example, when the active layer 12 is formed in a multiple-quantum well structure, the active layer 12 may have a structure that a barrier layer, a strain reinforcing layer, and a well layer are periodically stacked as one unit. Because the strain reinforcing layer has a smaller lattice constant than the barrier layer, it may further strengthen a strain applied to the well layer, for example, a compression strain. However, the structure of the active layer 12 is not limited to the above-described embodiment.

The active layer 12 may emit light having a wavelength of 400 nm to 900 nm, and may use a double heterostructure. In one embodiment of the present disclosure, a clad layer doped with a conductive dopant may be formed on and/or under the active layer 12 in the direction of the length L of each light emitting element LD. For example, the cladding layer may be formed of an AlGaN layer or an InAlGaN layer. According to an embodiment, the material such as AlGaN, AlInGaN, and the like may be used to form the active layer 12, and various materials may constitute the active layer 12. The active layer 12 may include a first surface in contact with the second semiconductor layer 13 and a second surface in contact with the first semiconductor layer 11.

When a signal (or a voltage) is applied to (or between) the first end EP1 and the second end EP2 of each light emitting element LD, electron-hole pairs are combined in the active layer 12 to emit light in each light emitting element LD. By controlling the light emitted from each light emitting element LD using this principle, each light emitting element LD may be used as a light source (or light emitting source) of various light emitting devices including the pixel PXL of the display device DD.

The first semiconductor layer 11 may be disposed on the active layer 12, and may include a semiconductor layer of a different type from the second semiconductor layer 13. For example, the first semiconductor layer 11 may include at least one n-type semiconductor layer. For example, the first semiconductor layer 11 may include any one semiconductor material of InAlGaN, GaN, AlGaN, InGaN, AlN, and InN, and may be an n-type semiconductor layer doped with a first conductive dopant (or an n-type dopant) such as Si, Ge, Sn, and the like. However, the material constituting the first semiconductor layer 11 is not limited thereto, and various other materials may constitute the first semiconductor layer 11. The first semiconductor layer 11 may include a lower surface in contact with the active layer 12 and an upper surface exposed to the outside in the direction of the length L of each light emitting element LD at the second end EP2 of the light emitting element LD. The upper surface of the first semiconductor layer 11 may be the second end EP2 (or the upper end) of each light emitting element LD.

In one embodiment, the second semiconductor layer 13 and the first semiconductor layer 11 may have different thicknesses in the direction of the length L (or the third direction DR3) of each light emitting element LD. For example, the first semiconductor layer 11 may have a relatively thicker thickness than the second semiconductor layer 13 in the direction of the length L (or the third direction DR3) of each light emitting element LD. Accordingly, the active layer 12 of each light emitting element LD may be disposed closer to the lower surface of the second semiconductor layer 13 (e.g., the first end EP1) than the upper surface (e.g., the second end EP2) of the first semiconductor layer 11.

Although each of the first semiconductor layer 11 and the second semiconductor layer 13 are illustrated as being composed of single layer, the present disclosure is not limited thereto. In one embodiment, according to the material of the active layer 12, each of the first semiconductor layer 11 and the second semiconductor layer 13 may further include at least one or more layers, for example, a cladding layer and/or tensile strain barrier reducing (TSBR) layer. The TSBR layer may be a strain mitigating layer that is disposed between semiconductor layers having different lattice structures and serves as a buffer for reducing a difference in lattice constant. The TSBR layer may be composed of a p-type semiconductor layer such as p-GaInP, p-AlInP, p-AlGaInP, and the like, but the present disclosure is not limited thereto.

According to the described embodiment, each light emitting element LD may further include a contact electrode (hereinafter referred to as "first contact electrode") disposed under the second semiconductor layer 13 (e.g., at the first end EP1) in addition to the first semiconductor layer 11, the active layer 12, and the second semiconductor layer 13 described above. In addition, according to another embodiment, each light emitting element LD may further include another contact electrode (hereinafter referred to as a "second contact electrode") disposed on the first semiconductor layer 11 (e.g., at the second end EP2).

Each of the first and second contact electrodes may be an ohmic contact electrode, but the present disclosure is not limited thereto. According to an embodiment, the first and second contact electrodes may be Schottky contact electrodes. The first and second contact electrodes may include a conductive material. For example, the first and second contact electrodes may include an opaque metal used alone or in combination with chromium (Cr), titanium (Ti), aluminum (Al), gold (Au), nickel (Ni), and oxides or alloys thereof, but the present disclosure is not limited thereto. According to an embodiment, the first and second contact electrodes may include transparent conductive oxides such as indium tin oxide (ITO), indium zinc oxide (IZO), zinc oxide (ZnO), indium gallium zinc oxide (IGZO), and indium tin zinc oxide (ITZO).

Materials included in the first and second contact electrodes may be the same or different from each other. The first and second contact electrodes may be substantially transparent or translucent. Accordingly, light generated by each light emitting element LD may transmit through each of the first and second contact electrodes to be emitted to the outside of the light emitting element LD. According to an embodiment, when the light generated by each light emitting element LD is emitted outside the light emitting element LD through a region excluding both ends EP1 and EP2 of each light emitting element LD without transmitting through the first and second contact electrodes, the first and second contact electrodes may include an opaque metal.

In one embodiment, each light emitting element LD may further include an insulating film 14 covering an outer peripheral surface of light emitting element LD along the length L. However, according to the described embodiment, the insulating film 14 may be omitted, and may be provided to cover only a portion of the light emitting stack 10.

The insulating film 14 may prevent an electrical short that may occur when the active layer 12 contacts conductive materials other than the first and second semiconductor layers 11 and 13. In addition, the insulation film 14 may reduce or minimize surface defects of the light emitting element LD, thereby improving lifespan and luminous efficiency of the light emitting element LD. In addition, when a plurality of light emitting elements LD are closely disposed, the insulating film 14 may prevent an unwanted short that may occur between the light emitting elements LD. As long as preventing the active layer 12 from a short circuit with an external conductive material, whether or not the insulating film 14 is provided is not limited.

The insulating film 14 may be provided in a form that entirely covers an outer peripheral surface (e.g., the outer circumferential surface) of the light emitting stack 10 including the second semiconductor layer 13, the active layer 12, and the first semiconductor layer 11.

In the above-described embodiment, the insulating film 14 has been described in a form that entirely covers the outer peripheral surfaces (e.g., the outer circumferential surfaces) of each of the second semiconductor layer 13, the active layer 12, and the first semiconductor layer 11, but the present disclosure is not limited thereto. According to an embodiment, when each light emitting element LD includes the first contact electrode, the insulating film 14 may entirely cover the outer peripheral surface (e.g., the outer circumferential surface) of each of the first contact electrode, the second semiconductor layer 13, the active layer 12, and the first semiconductor layer 11. In addition, according to another embodiment, the insulating film 14 may not entirely cover the outer peripheral surface (e.g., the outer circumferential surface) of the first contact electrode, or may cover only a portion of the outer peripheral surface (e.g., the outer circumferential surface) of the first contact electrode and may not cover the rest of the outer peripheral surface (e.g., the outer circumferential surface) of the first contact electrode. Further, according to the described embodiment, when the first contact electrode is disposed at the first end EP1 (or the lower end) of each light emitting element LD, and the second contact electrode is disposed at the second end EP2 (or the upper end) of each light emitting element LD, the insulating film 14 may expose at least a portion of each of the first and second contact electrodes.

The insulating film 14 may include a transparent insulating material. For example, the insulating film 14 may include at least one insulating material selected from the group consisting of silicon oxide (SiOx), silicon nitride (SiNx), silicon oxynitride (SiOxNy), aluminum oxide (AlOx), titanium oxide (TiOx), hafnium oxide (HfOx), titanium strontium oxide (SrTiOx), cobalt oxide (CoxOy), magnesium oxide (MgO), zinc oxide (ZnO), rucenium oxide (RuOx), nickel oxide (NiO), tungsten oxide (WOx), tantalum oxide (TaOx), gadolinium oxide (GdOx), zirconium oxide (ZrOx), gallium oxide (GaOx), vanadium oxide (VxOy), ZnO:Al, ZnO:B, InxOy:H, niobium oxide (NbxOy), magnesium fluoride (MgFx), aluminum fluoride (AlFx), Alucone polymer film, titanium nitride (TiN), tantalum nitride (TaN), aluminum nitride (AlNx), gallium nitride (GaN), tungsten nitride (WN), hafnium nitride (HfN), niobium nitride (NbN), gadolinium nitride (GdN), zirconium nitride (ZrN), vanadium nitride (VN), and the like, but the present disclosure is not limited thereto, and various materials having insulating properties may be used as a material of the insulating film 14.

The insulating film 14 may be provided in the form of a single layer or in the form of a multilayer including at least a double layer. For example, when the insulating film 14 is formed of a double layer including a first layer and a second layer sequentially stacked, the first layer and the second layer may be formed of different materials (or substance), and may be formed by different processes. According to an embodiment, the first layer and the second layer may include the same material and may be formed by a continuous process.

In some embodiments, each light emitting element LD may further include a reflective member 15 covering the outer peripheral surface (or the outer circumferential surface) of the insulating film 14.

The reflective member 15 may be formed of a material with a desired reflectivity (e.g., set or predetermined reflectivity) so that the light emitted from each light emitting element LD may be focused at a specific area while propagating in an image display direction. For example, the reflective member 15 may be formed of a conductive material (or substance) having desired reflectivity (e.g., a set or predetermined reflectivity). The reflective member 15 may include an opaque metal. The reflective member 15 may include the same material as the first electrode EL1 or may include at least one material selected from materials discussed, for example, as constituent materials of the first electrode EL1.

In one embodiment, the reflective member 15 may have a constant inclination in an oblique direction inclined with respect to the third direction DR3 in order to collimate the light emitted from the active layer 12 of each light emitting element LD to a specific area. As described above, because each light emitting element LD has an elliptical column shape whose diameter increases as it goes upward in the direction of the length L (or the third direction DR3), the insulating film 14 covering the outer peripheral surface (e.g., the outer circumferential surface) of the light emitting stack 10 and the reflective member 15 covering the outer peripheral surface (e.g., the outer circumferential surface) of the insulating film 14 may have a constant inclination when viewed in cross section. For example, when the reflective member 15 has a constant inclination, the light emitted from the active layer 12 of each light emitting element LD may be reflected by the reflective member 15 to be focused only in a specific area. That is, the reflective member 15 may focus light emitted radially from the active layer 12 of each light emitting element LD to the specific area.

The above-described reflective member 15 may partially cover the outer peripheral surface (e.g., the outer circumferential surface) of the insulating film 14 to expose a portion of the insulating film 14. In this case, a height h of the reflective member 15 in the third direction DR3 may be smaller than a length L of each light emitting element LD. One end (or a lower end) of the reflective member 15 may be disposed at the same line (or on the same plane) as the first end EP1 of each light emitting element LD, and the other end (or an upper end) of the reflective member 15 may be disposed under the second end EP2 of each light emitting element LD in the third direction DR3.

In each light emitting element LD, the second semiconductor layer 13 and the first semiconductor layer 11 including different types of semiconductor layers may be disposed to face each other in the direction of the length L (or the third direction DR3). For example, in some embodiments, in each light emitting element LD, the second semiconductor layer 13 and the first semiconductor layer 11 may be disposed at the opposite surfaces of the active layer 12 in the direction of the length L. The second semiconductor layer 13 may be disposed at the first end EP1 (or the lower end) of each light emitting element LD, and the first semiconductor layer 11 may be disposed at the second end EP2 (or the upper end) of the corresponding light emitting element LD. Each light emitting element LD may be a light emitting element of a vertical structure in which the second semiconductor layer 13, the active layer 12, and the first semiconductor layer 11 are sequentially stacked in the direction of the length L (or the third direction DR3).

Each of the above-described light emitting elements LD may be used as a light emitting source (or light source) of various display devices DD. The above-described light emitting elements LD may be bonded to the conductive pattern CP to be disposed on the first electrode EL1.

The conductive pattern CP may be provided and/or formed on the first electrode EL1. The conductive pattern CP may be a bonding metal bonded to the light emitting elements LD. In an embodiment, the conductive pattern CP may be used as a reflective member for guiding light emitted from the light emitting elements LD in the image display direction of the display device DD. To this end, the conductive pattern CP may be made of an opaque conductive material with a desired reflectivity (e.g., a set or predetermined reflectivity). The conductive pattern CP may include the same material as the first electrode EU or may include at least one material selected from materials discussed, for example, as constituent materials of the first electrode EL1. The first end EP1 of each of the light emitting elements LD may contact the conductive pattern CP. That is, the second semiconductor layer 13 of each of the light emitting elements LD may contact the conductive pattern CP.

In one embodiment, the conductive pattern CP may be disposed between the first electrode EU and the first end EP1 of each of the light emitting elements LD in direction of the length L of each of the light emitting elements LD. The conductive pattern CP may be a connection means electrically connecting the first electrode EU and the first end EP1 of each light emitting element LD. That is, the conductive pattern CP may electrically connect the first electrode EL1 and the p-type semiconductor layer of each light emitting element LD, for example, the second semiconductor layer 13. In one embodiment, the first electrode EL1 may be an anode.

When the conductive pattern CP contacts the first end EP1 of each light emitting element LD, the reflective member 15 disposed on the outer peripheral surface (e.g., the outer circumferential surface) of each light emitting element LD and the conductive pattern CP may be electrically and/or physically connected. As described above, the reflective member 15 in each of the light emitting elements LD may be spaced from the second end EP2 of the light emitting element LD so as to expose a portion of the insulating film 14 of the corresponding light emitting element LD. In this case, because the reflective member 15 is spaced from the second end EP2 of the corresponding light emitting element LD even if the reflective member 15 of each light emitting element LD contacts the conductive pattern CP, the reflective member 15 may not be in contact with the first semiconductor layer 11 disposed at the second end EP2. Accordingly, the first end EP1 and the second end EP2 of each light emitting element LD may be electrically separated.

The insulating layer INS may be provided and/or formed on the planarization layer PLL, a portion of the protective layer PSV, and a portion of the bridge pattern BRP, respectively. The insulating layer INS may include an inorganic insulating layer including an inorganic material or an organic insulating layer including an organic material. In one embodiment, the insulating layer INS may be used as a planarization layer for alleviating a step difference due to constituent elements disposed thereunder in the display element layer DPL. To this end, the insulating layer INS may be formed of an organic insulating layer including an organic material.

In addition, the insulating layer INS may be provided between the light emitting elements LD bonded to the conductive pattern CP. The insulating layer INS may be disposed between the light emitting elements LD so that the remaining portions except for the second end EP2 (or the upper end) in each light emitting element LD may be covered by the insulating layer INS.

The second electrode EL2 may be provided and/or formed on the second end EP2 of each of the light emitting elements LD. The second electrode EL2 may contact the second end EP2 of each of the light emitting elements LD and may be electrically connected to the second end EP2 of each of the light emitting elements LD. For example, the second electrode EL2 may be electrically connected to the first semiconductor layer 11 disposed at the second end EP2 of each of the light emitting elements LD.

The second electrode EL2 may be formed of various transparent conductive materials (or substance) so that light emitted from each of the light emitting elements LD proceeds in the image display direction of the display device DD without loss. For example, the second electrode EL2 may include at least one of various transparent conductive materials (or substance) including indium tin oxide (ITO), indium zinc oxide (IZO), zinc oxide (ZnO), indium gallium zinc oxide (IGZO), indium tin zinc oxide (ITZO), or the like, and may be configured to be substantially transparent or semi-transparent to satisfy a desired transmittance (e.g., a set or predetermined transmittance) (or transmittance). However, the material of the second electrode EL2 is not limited to the above-described embodiment.

The above-described second electrode EL2 may be electrically connected to the driving voltage line DVL through the bridge pattern BRP. Accordingly, the voltage of the second driving power supply VSS applied to the driving voltage line DVL may be transferred to the second electrode EL2. In one embodiment, the second electrode EL2 may be a cathode.

In some embodiments, the display element layer DPL may further include a light blocking pattern LBP. The light blocking pattern LBP may define an emission area EMA in which light is emitted from the pixel PXL (or pixel area PXA) and a non-emission area NEMA in which light is not emitted therefrom.

The light blocking pattern LBP may include a plurality of openings OP overlapping each of the light emitting elements LD. Here, the emission area EMA may correspond to each opening OP.

The light blocking pattern LBP may be disposed in the non-emission area NEMA in the pixel area PXA in which the pixel PXL is provided. The light blocking pattern LBP may be a photosensitive material in which the remaining area except for the opening OP corresponding to the emission area EMA, is formed of a light blocking material or the like, but the present disclosure is not limited thereto. The above-described light blocking pattern LBP may prevent or reduce color mixing of light emitted from each of the adjacent pixels PXL. In addition, the light blocking pattern LBP may be formed of a material that absorbs or blocks incident light, and may absorb light incident on the display device DD from the outside, thereby preventing a phenomenon in which constituent elements disposed thereunder are visually recognized from the outside.

In one embodiment, the light blocking pattern LBP may be formed of a positive photosensitive material. For example, the positive photosensitive material may include a positive photosensitive resin.

The light blocking pattern LBP may be formed by using light emitted from the light emitting elements LD. For example, after coating a positive photosensitive material entirely on the second electrode EL2 and the insulating layer INS, a corresponding signal (or voltage) may be transferred to (or between) the first end EP1 and the second end EP2 of each of the light emitting elements LD to drive the light emitting elements LD. After exposing the positive photosensitive material with light emitted by the light emitting elements LD, a development process is performed, so that a portion on which the light is incident, for example, a portion corresponding to (or overlapping) the light emitting elements LD among the positive photosensitive materials is removed, thereby forming the light blocking pattern LBP including a plurality of openings OP exposing the second electrode EL2 on the light emitting elements LD to the outside, as shown in FIG. 6B. In this case, each light emitting element LD may emit blue light, and a wavelength of light emitted from each light emitting element LD may be similar to a wavelength of light used in an exposure process during a general photolithography process. When a portion of the second electrode EL2 is exposed to the outside by the openings OP of the light blocking pattern LBP, the second electrode EL2 may also be used as a heat dissipation member that efficiently emits heat generated from the light emitting elements LD. Each of the openings OP of the light blocking pattern LBP may have the same size as a size of the second end EP2 of the corresponding light emitting element LD.

The light blocking pattern LBP may be provided on the second electrode EL2 on the insulating layer INS disposed between light emitting elements LD adjacent in the first direction DR1. The light blocking pattern LBP provided on the second electrode EL2 on the insulating layer INS disposed between the light emitting elements LD adjacent in the first direction DR1 may have a constant width W in a direction that is perpendicular to the direction of the length L of each of the light emitting elements LD (or the third direction DR3). However, the present disclosure is not limited thereto, and the light blocking patterns LBP may have a width W different from each other depending on an amount (or intensity) of light and a light emitting angle of light emitted from each of the light emitting elements LD according to the described embodiment. For example, as shown in FIG. 9, the light blocking pattern LBP may have a cross section of a trapezoidal shape whose width W decreases as it goes upward in the direction of the length L (or the third direction DR3) of each of the light emitting elements LD. In addition, according to another embodiment, the light blocking pattern LBP may have a cross section such as a semi-elliptic shape, a semicircle shape (or a hemispherical shape), and the like whose width W decreases as it goes upward in the direction of the length L (or the third direction DR3) of each of the light emitting elements LD. In addition, according to another embodiment, the light blocking pattern LBP may have a cross section of an inverted tapered shape whose width W decreases as it goes downward in the direction of the length L (or the third direction DR3) of each of the light emitting elements LD.

A detailed description of a method of forming the light blocking pattern LBP will be described later with reference to FIGS. 10L and 10M.

As described above, according to an embodiment of the present disclosure, the light blocking pattern LBP including a plurality of openings OP may be formed by using light emitted from the light emitting elements LD. In the process of forming the light blocking pattern LBP, the light emitting elements LD are used as an exposure source, so that a separate exposure source for the exposure process is not required, thereby simplifying manufacturing process and reducing the manufacturing cost.

In addition, according to the above-described embodiment, because the light blocking pattern LBP is disposed in the remaining area except for the portion corresponding to (or overlapping) the light emitting elements LD in the pixel PXL (or the pixel area PXA), light incident from the outside is absorbed or blocked, so that a phenomenon in which constituent elements disposed under the light blocking pattern LBP are visually recognized from the outside may be prevented.

Additionally, according to the above-described embodiment, each light emitting element LD may correspond to each of the openings OP of the light blocking pattern LBP, so that an exit surface of light from the light emitting elements LD may be exposed to the outside. Accordingly, constituent elements disposed on the light emitting elements LD may be omitted or minimized so that light emitted from the light emitting elements LD may proceed in the image display direction of the display device DD without loss. Accordingly, the emission efficiency of the pixel PXL may be further improved.

FIGS. 10A-10M are cross-sectional views sequentially illustrating a manufacturing method of the pixel PXL of FIG. 6A.

Hereinafter, a manufacturing method of the pixel PXL illustrated in FIG. 6A will be sequentially described with reference to FIGS. 10A-10M.

In the present specification, it is described that the manufacturing steps of the pixels PXL are sequentially performed according to the cross-sectional view, but unless the spirit of the disclosure is changed, it is obvious that some steps shown as being continuously performed are performed concurrently (e.g., performed simultaneously), or the order of each step is changed, some steps are omitted, or other steps are further included between the steps.

Figure 10A:
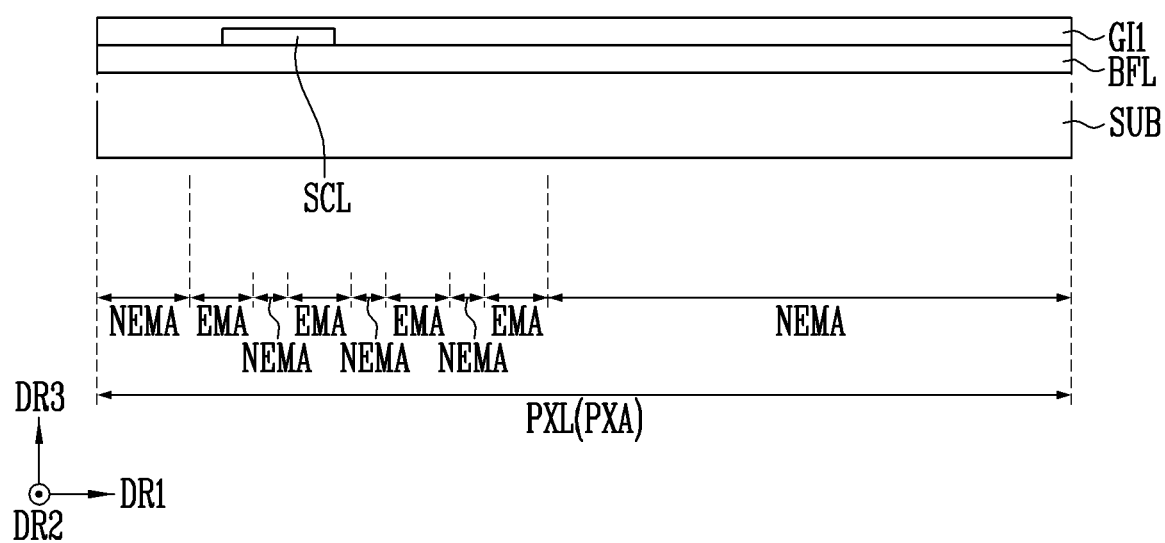
FIGS. 10A-10M are cross-sectional views sequentially illustrating a manufacturing method of the pixel of FIG. 6A.

Referring to FIGS. 6A and 10A, a buffer layer BFL may be formed entirely on a substrate SUB, and a semiconductor pattern SCL may be locally formed on the buffer layer BFL.

The semiconductor pattern SCL may be made of silicon (Si), that is, amorphous silicon, or may be made of polysilicon. When the semiconductor pattern SCL is made of amorphous silicon, a crystallization process may be further performed using a laser or the like. According to the described embodiment, the semiconductor pattern SCL may be made of a semiconductor oxide including a binary compound (ABx), a ternary compound (ABxCy), a four constituent element compound (ABxCyDz), or the like including indium (In), zinc (Zn), gallium (Ga), tin (Sn), titanium (Ti), aluminum (Al), hafnium (Hf), zirconium (Zr), magnesium (Mg), or the like. These may be used alone or in combination with each other.

Subsequently, a first gate insulating layer GI1 covering the semiconductor pattern SCL may be formed.

Figure 10B:
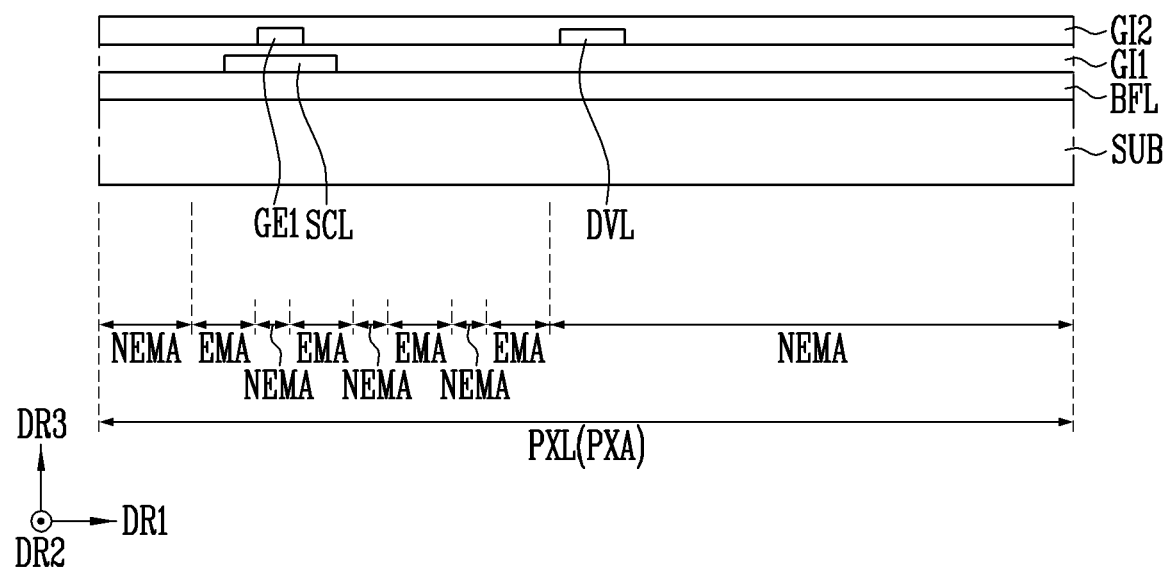
Figure 10C:
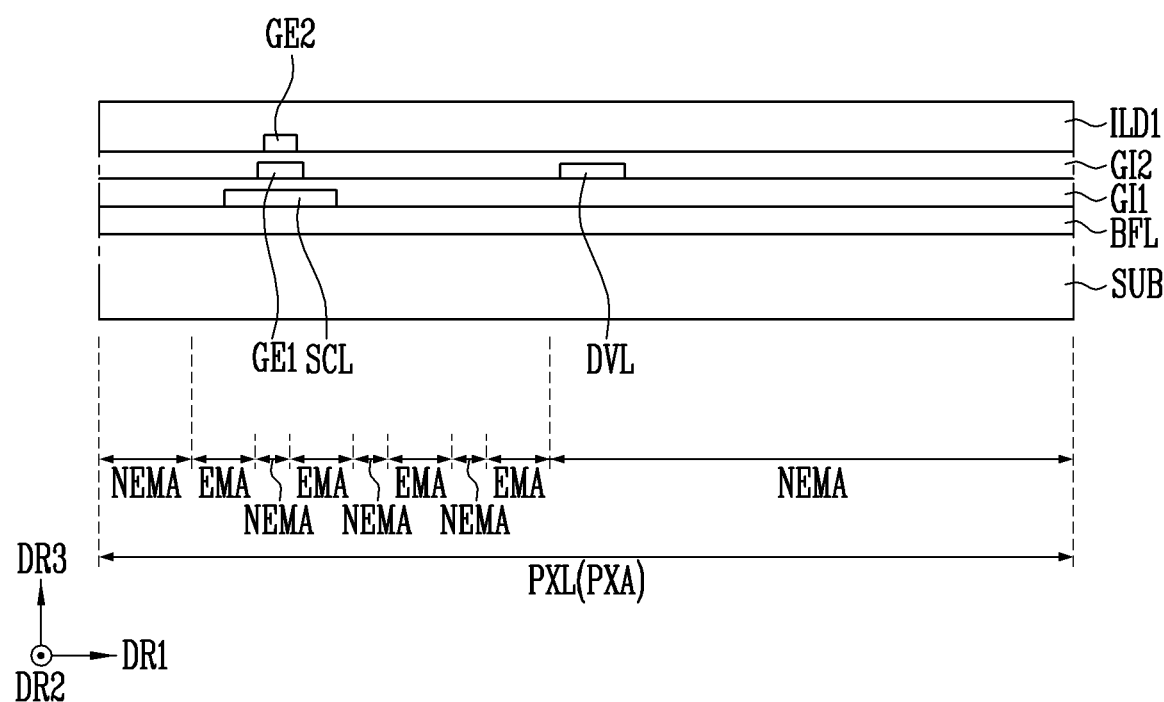
Figure 10D:
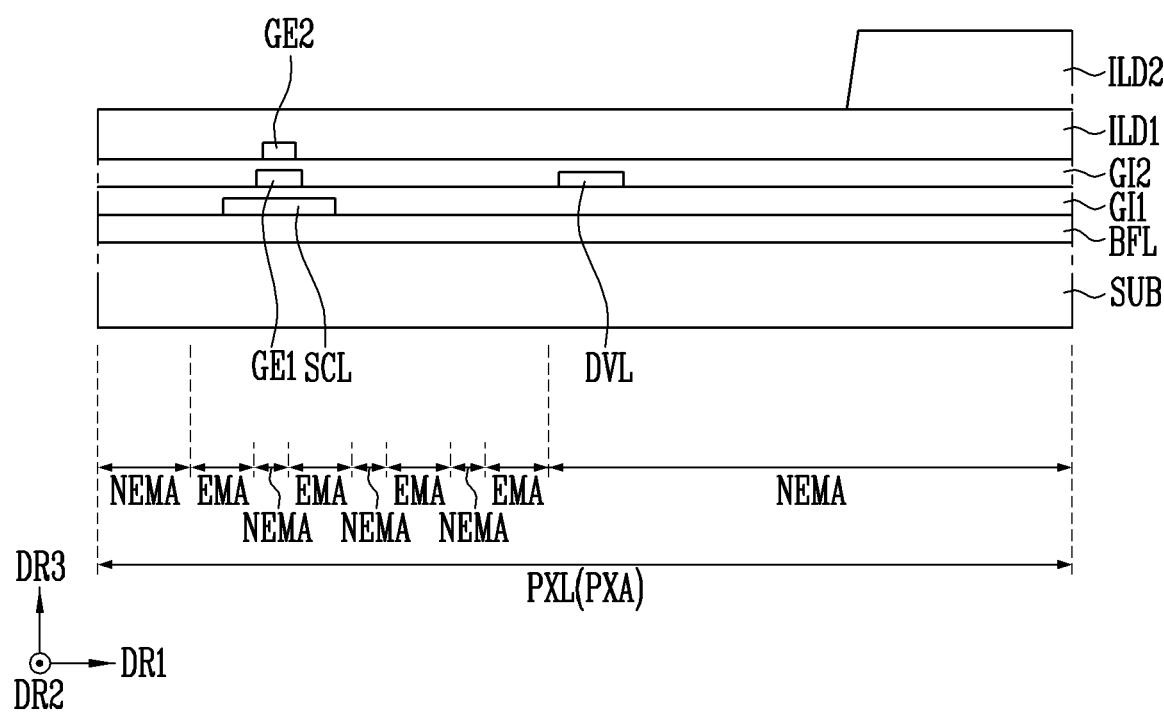
Figure 10E:
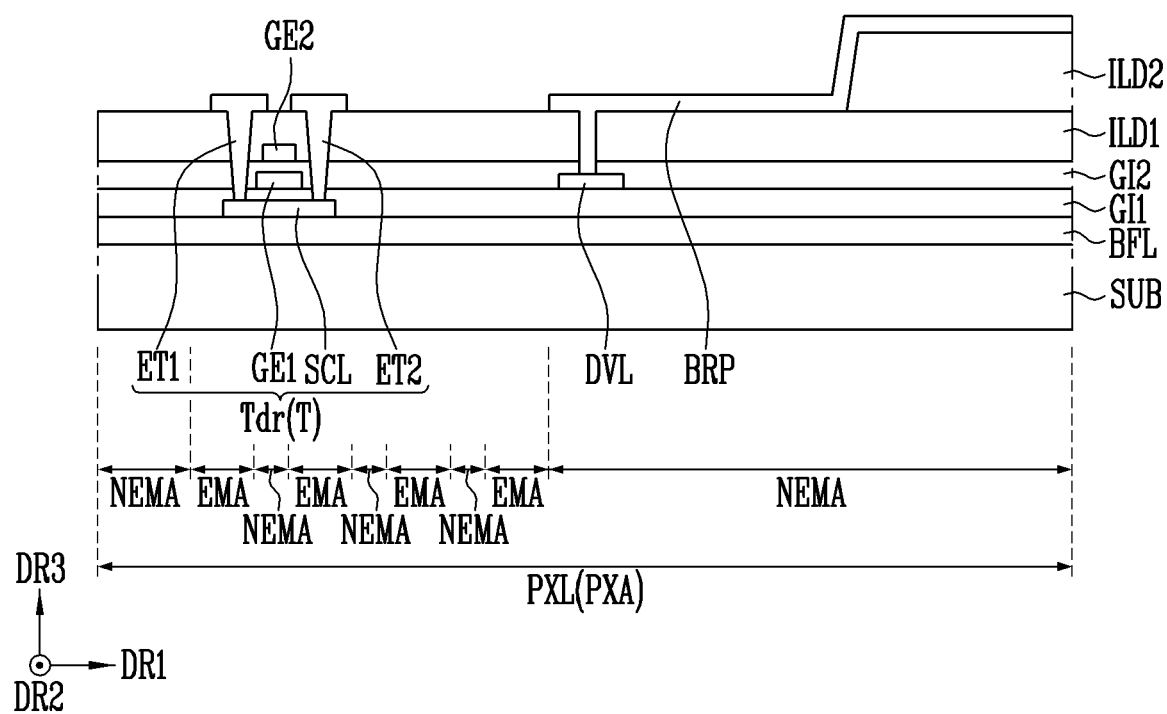
Figure 10F:
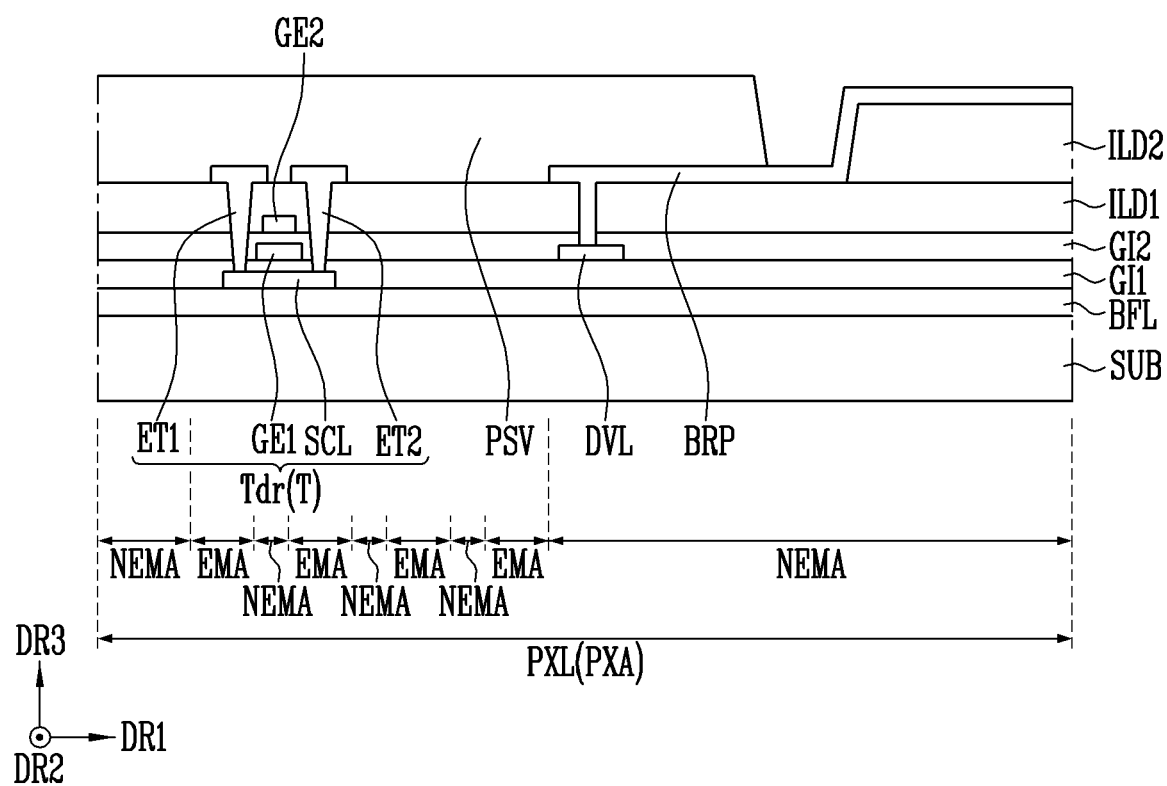
Figure 10G:
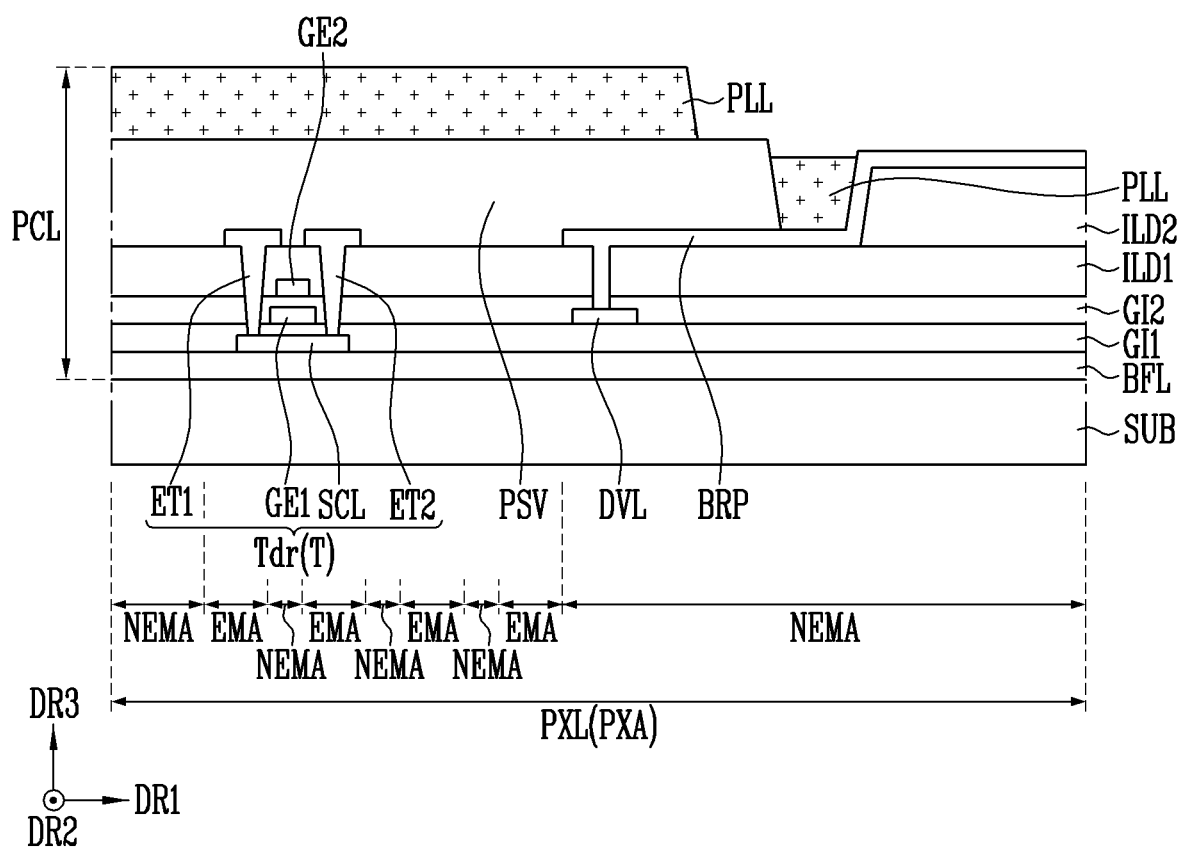
Figure 10H:
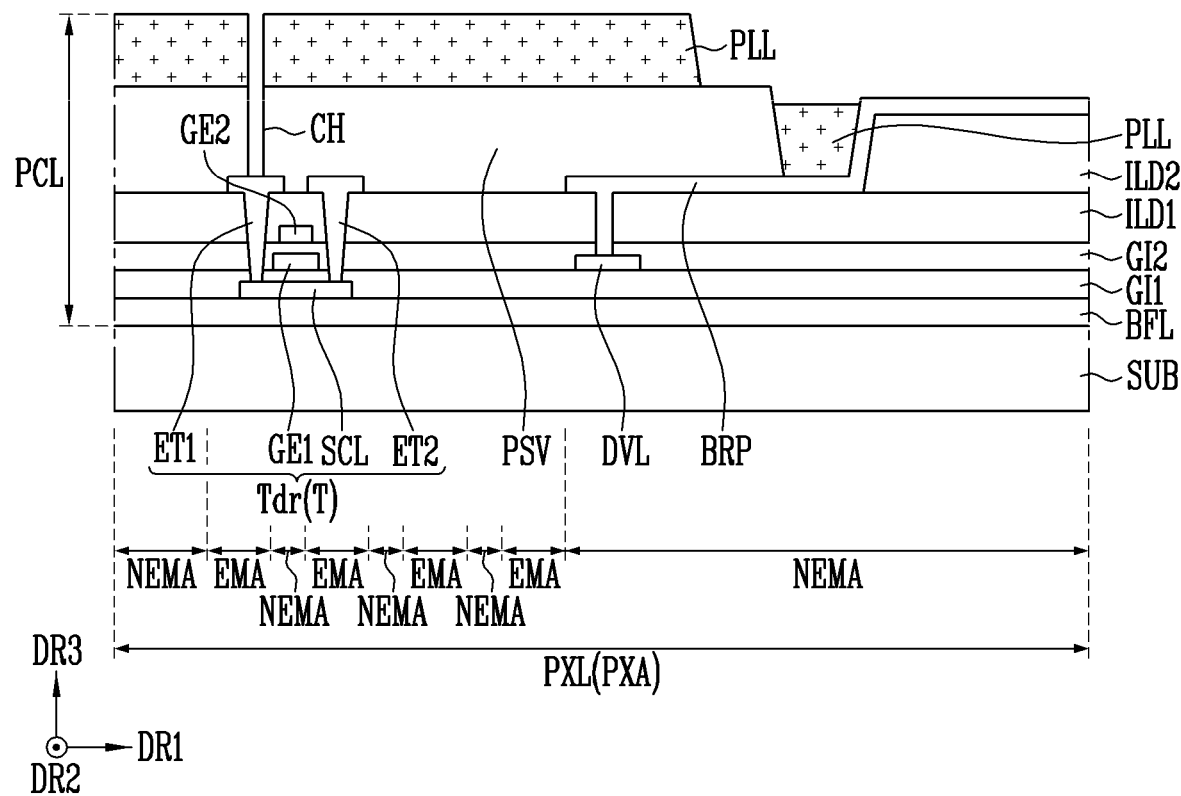
Figure 10I:
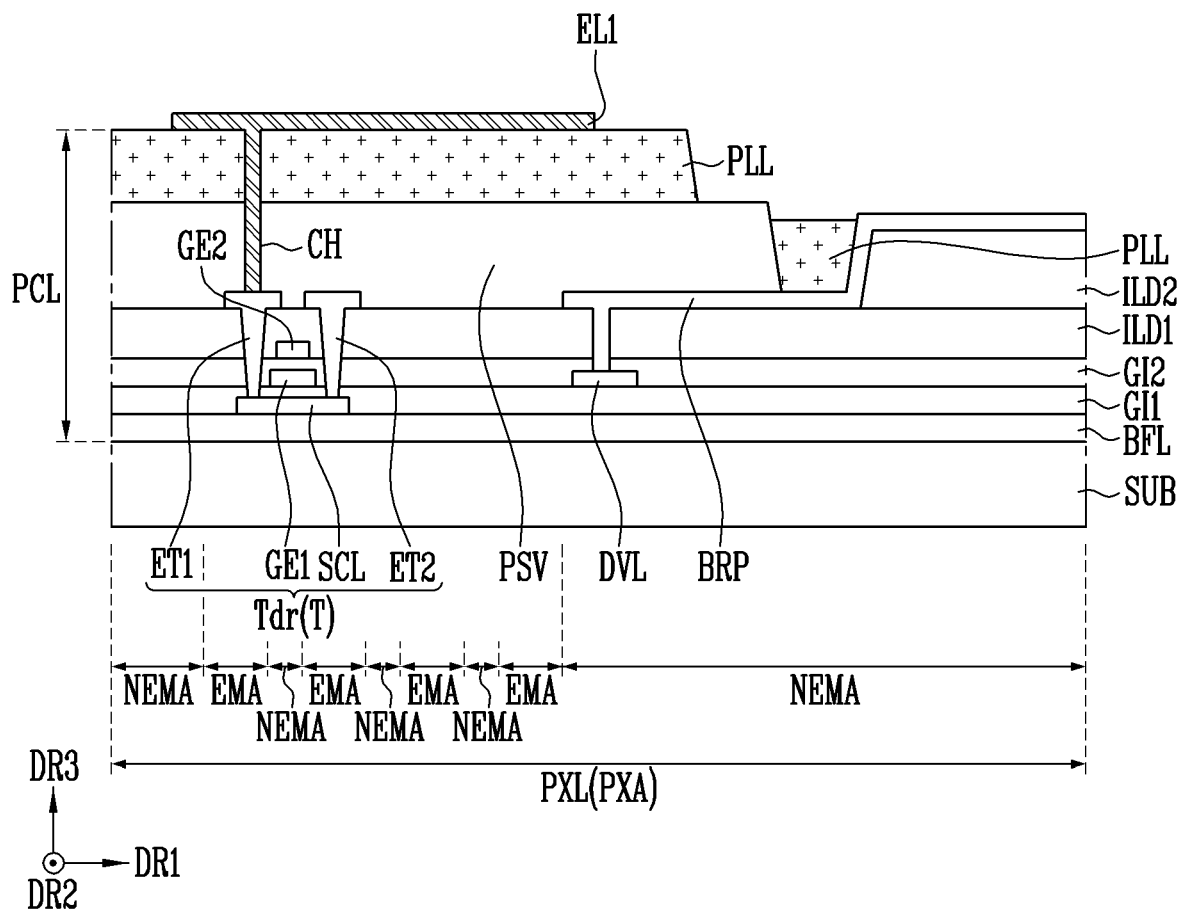
Figure 10J:
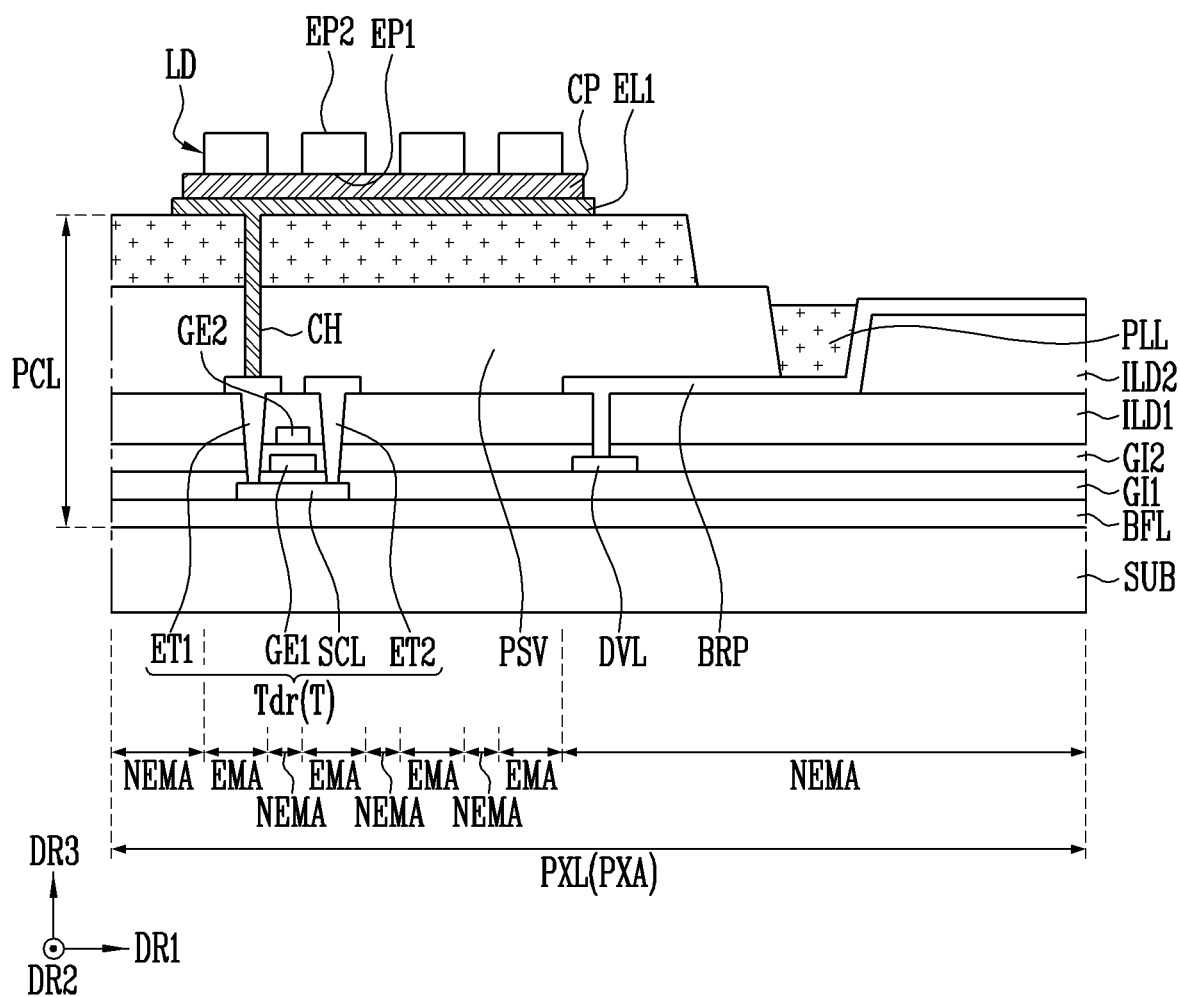
Figure 10K:
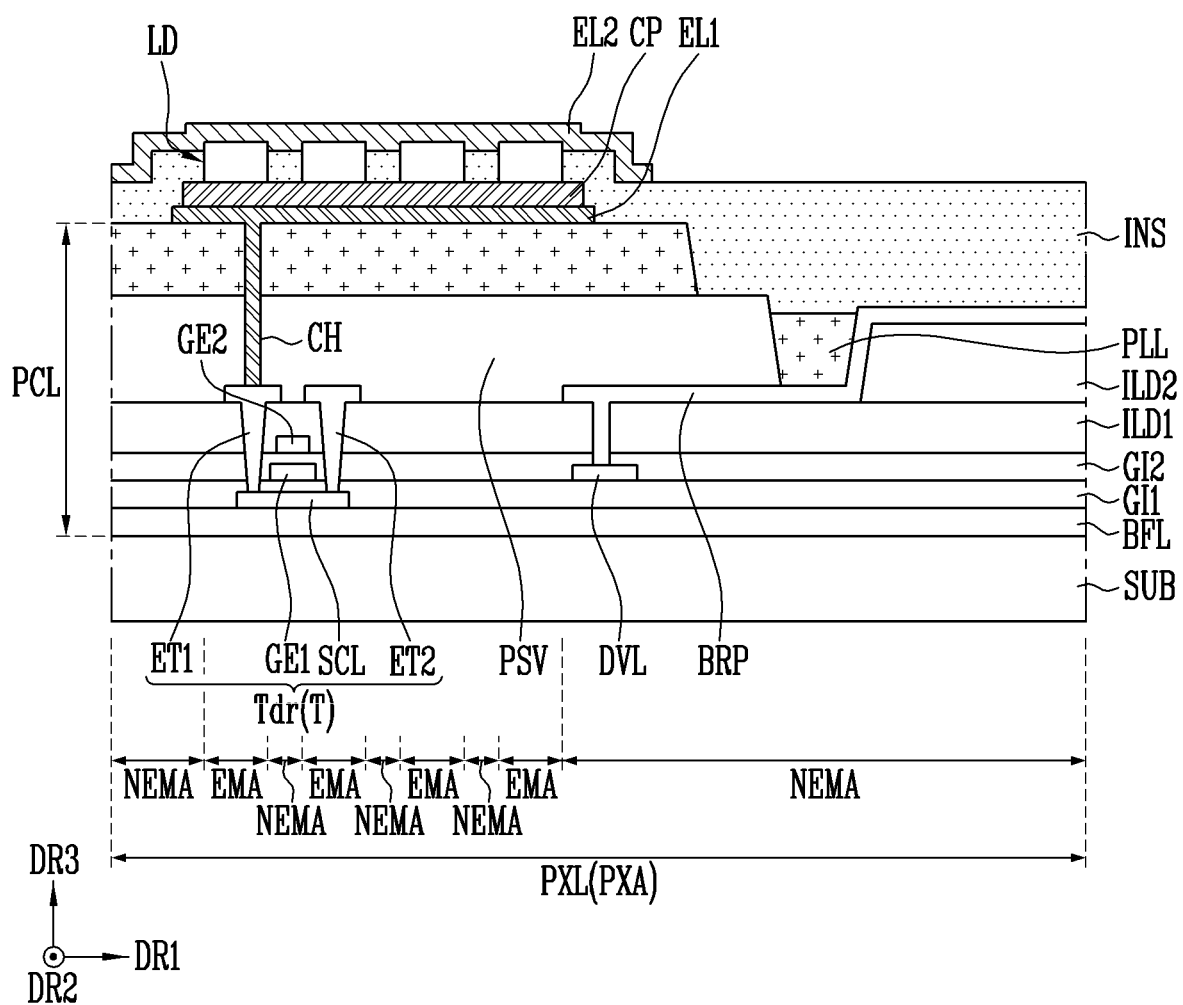
Figure 10L:
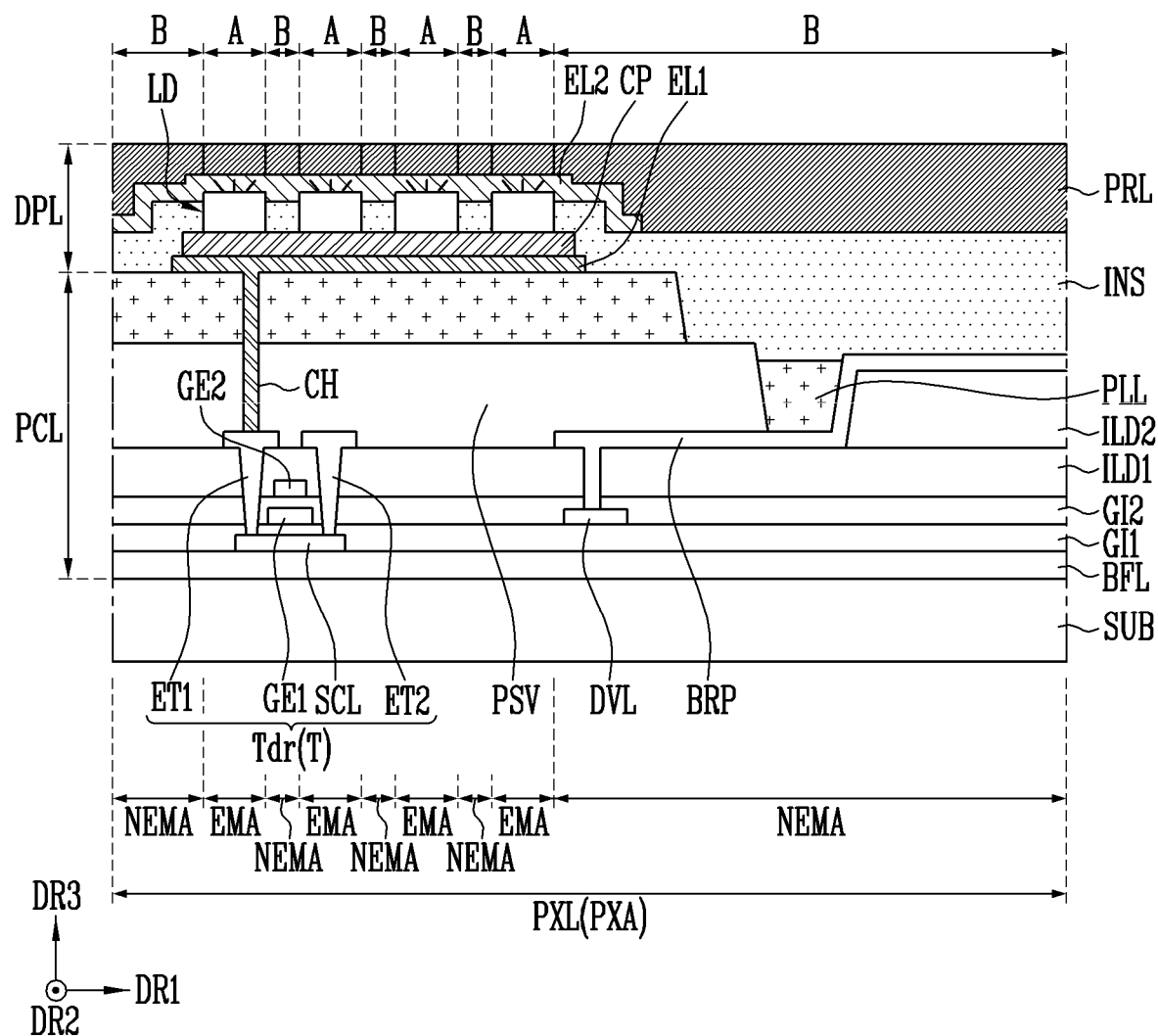
Figure 10M:
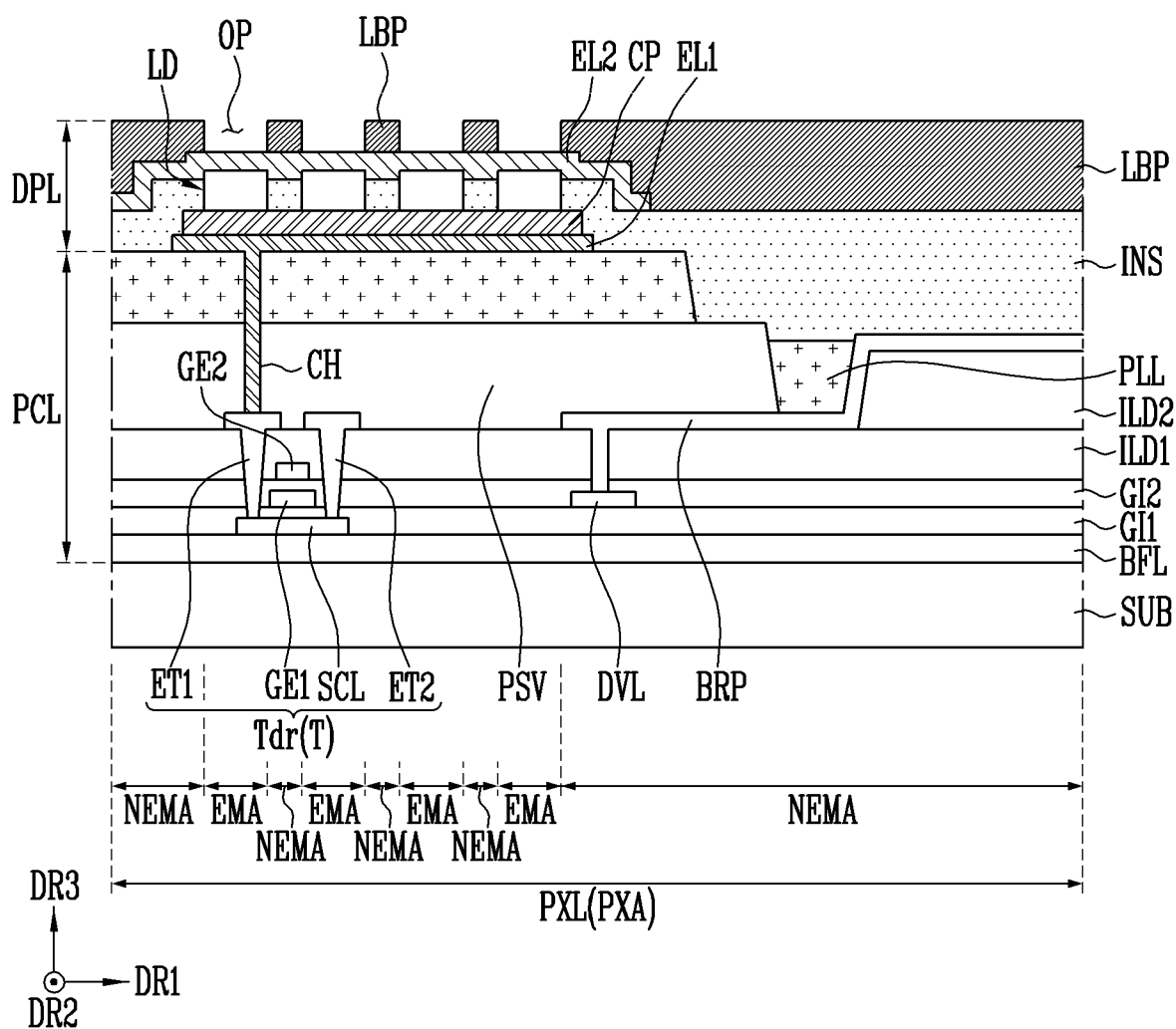

Referring to FIGS. 6A, 10A, and 10B, a first conductive layer may be formed on the first gate insulating layer GI1. In one embodiment, the first conductive layer may include a first gate electrode GE1 and a driving voltage line DVL.

The first gate electrode GE1 may be disposed on the first gate insulating layer GI1 to overlap the semiconductor pattern SCL in the third direction DR3. One region of the semiconductor pattern SCL overlapping the first gate electrode GE1 in the third direction DR3 may be a channel region of the transistor T. Other regions of the semiconductor pattern SCL not overlapping the first gate electrode GE1 may be a first contact region and a second contact region.

The driving voltage line DVL may be electrically connected to an external power supply. Accordingly, a suitable signal (e.g., a set or predetermined signal) (or voltage) may be supplied from the power supply to the driving voltage line DVL.

A second gate insulating layer GI2 may be formed on the first conductive layer including the first gate insulating layer GI1 and the driving voltage line DVL.

Referring to FIGS. 6A and 10A-10C, a second conductive layer may be formed on the second gate insulating layer GI2. In one embodiment, the second conductive layer may include a second gate electrode GE2. The second gate electrode GE2 may be a gate electrode, a power line, or a signal line of another transistor, or may form a capacitor with another electrode.

Subsequently, a first interlayer insulating layer ILD1 may be formed on the second conductive layer.

Referring to FIGS. 6A and 10A-10D, a second interlayer insulating layer ILD2 may be formed on the first interlayer insulating layer ILD1. The second interlayer insulating layer ILD2 may be locally formed on the first interlayer insulating layer ILD1.

Referring to FIGS. 6A and 10A-10E, a portion of each of the first interlayer insulating layer ILD1, the second gate insulating layer GI2, and the first gate insulating layer GI1 disposed on each of the first and second contact areas of the semiconductor pattern SCL may be removed to expose a portion of each of the first and second contact areas of the semiconductor pattern SCL. In addition, a portion of each of the first interlayer insulating layer ILD1 and the second gate insulating layer GI2 disposed on the driving voltage line DVL may be removed to expose a portion of the driving voltage line DVL.

Subsequently, a third conductive layer may be formed on the second interlayer insulating layer ILD2 and the first interlayer insulating layer ILD1. In one embodiment, the third conductive layer may include first and second terminals ET1 and ET2 and a bridge pattern BRP.

The first terminal ET1 may contact the first contact area of the semiconductor pattern SCL, and the second terminal ET2 may contact the second contact area of the semiconductor pattern SCL. The first terminal ET1 and the second terminal ET2 may be spaced from each other on the semiconductor pattern SCL. The first terminal ET1 may be a source electrode, and the second terminal ET2 may be a drain electrode.

The bridge pattern BRP may be disposed on the exposed driving voltage line DVL and may be electrically and/or physically connected to the driving voltage line DVL. The bridge pattern BRP may be an intermediate medium electrically connecting the second electrode EL2 and the driving voltage line DVL to be described later.

Referring to FIGS. 6A and 10A-10F, a protective layer PSV may be formed on the third conductive layer. In the drawings, the protective layer PSV is shown to cover only a portion of the bridge pattern BRP, but the present disclosure is not limited thereto. According to the described embodiment, the protective layer PSV may entirely cover the bridge pattern BRP.

Referring to FIGS. 6A and 10A-10G, a planarization layer PLL may be formed on the protective layer PSV and the bridge pattern BRP. The planarization layer PLL may be a constituent element that alleviates a step difference due to constituent elements disposed thereunder, and may include an organic insulating layer including an organic material.

Referring to FIGS. 6A and 10A-10H, a contact hole CH exposing a portion of the first terminal ET1 of the transistor T may be formed by removing portions of each of the protection layer PSV and the planarization layer PLL.

Referring to FIGS. 6A and 10A-10I, a fourth conductive layer may be formed on the planarization layer PLL. In one embodiment, the fourth conductive layer may include the first electrode EL1. The first electrode EL1 may be electrically connected to the first terminal ET1 of the transistor T through the contact hole CH.

Referring to FIGS. 6A and 10A-10J, a conductive pattern CP bonded to a plurality of light emitting elements LD may be formed on the first electrode EL1. In this case, the first end EP1 of each of the light emitting elements LD, for example, a second semiconductor layer (refer to "13" in FIGS. 7 and 8) may contact the conductive pattern CP.

The first electrode EL1 may be electrically connected to the second semiconductor layer 13 of each of the light emitting elements LD through the conductive pattern CP.

Referring to FIGS. 6A and 10A-10K, an insulating layer INS may be formed on the planarization layer PLL, a portion of the protective layer PSV, and a portion of the bridge pattern BRP. Also, the insulating layer INS may be formed between the light emitting elements LD. In this case, because the insulating layer INS is disposed between the light emitting elements LD, the remaining portions except for the second end EP2 of each light emitting element LD may be covered by the insulating layer INS. Here, the first semiconductor layer 11 described with reference to FIGS. 7 and 8 may be disposed at the second end EP2 of each light emitting element LD.

Subsequently, a fifth conductive layer may be formed on the insulating layer INS. In one embodiment, the fifth conductive layer may include the second electrode EL2. The second electrode EL2 may be formed on the second end EP2 of each of the light emitting elements LD to contact the second end EP2 of each of the light emitting elements LD. In addition, the second electrode EL2 may be electrically connected to the driving voltage line DVL through the bridge pattern BRP.

Referring to FIGS. 6A and 10A-10L, a photosensitive material PRL may be entirely coated on the second electrode EL2 and the insulating layer INS. In one embodiment, the photosensitive material PRL may be a positive photosensitive resin.

The photosensitive material PRL may include a first area A corresponding to each of the light emitting elements LD and a second area B excluding the first area A. Here, the first area A may correspond to the emission area EMA of the pixel area PXA in which the pixel PXL is disposed (or provided), and the second area B may correspond to the non-emission area NEMA of the pixel area PXA.

After the photosensitive material PRL is coated on the insulating layer INS and the second electrode EL2, the light emitting elements LD may be driven by applying a signal (or voltage) corresponding to (or between) both ends EP1 and EP2 of each of the light emitting elements LD through the first electrode EU and the second electrode EL2. When a signal corresponding to each of the first end EP1 and the second end EP2 is applied in each of the light emitting elements LD, electron-hole pairs may be combined to emit light in the active layer (e.g., the active layer "12" in FIGS. 7 and 8) of the corresponding light emitting element LD.

As the photosensitive material PRL is coated over the second electrode EL2 on the light emitting elements LD, the photosensitive material PRL may be exposed with light emitted from the light emitting elements LD. At this time, because each of the light emitting elements LD includes the reflective member 15 described with reference to FIGS. 7 and 8, the light emitted from each light emitting element LD may intensively proceed only to a specific area, for example, the image display direction (or the direction of the second end EP2 of each of the light emitting elements LD) of the display device (refer to "DD" in FIG. 1) without proceeding radially. In this case, the light emitted from the light emitting elements LD may be incident on only the first area A of the photosensitive material PRL corresponding to (or overlapping) the light emitting elements LD, and the light may be not incident on the second area B of the photosensitive material PRL not corresponding to the light emitting elements LD.

Using the light emitted from the above-described light emitting elements LD as an exposure source, the photosensitive material PRL disposed on the light emitting elements LD may be exposed to light, and then a development process is performed.

Subsequently, referring to FIGS. 6A and 10A-10M, the first area A of the photosensitive material PRL on which the light emitted from each of the light emitting elements LD is incident through the above-described process may be removed. Accordingly, the light blocking pattern LBP including a plurality of openings OP exposing the second electrode EL2 on the light emitting elements LD corresponding to the first area A of the photosensitive material PRL to the outside, may be formed.

The light blocking pattern LBP may be disposed to correspond to the non-emission area NEMA of the pixel area PXA, and each of the openings OP may be disposed to correspond to the emission area EMA of the pixel area PXA. The light blocking pattern LBP may prevent the mixing of light emitted from each of the adjacent pixels PXL and absorb light incident on the display device DD from the outside, thereby preventing constituent elements disposed thereunder from being visually recognized to the outside.

For the pixel PXL finally manufactured through the above-described manufacturing process, the manufacturing process may be simplified and the manufacturing cost may be reduced by forming the light blocking pattern LBP using light emitted from the light emitting elements LD.

Figure 11:
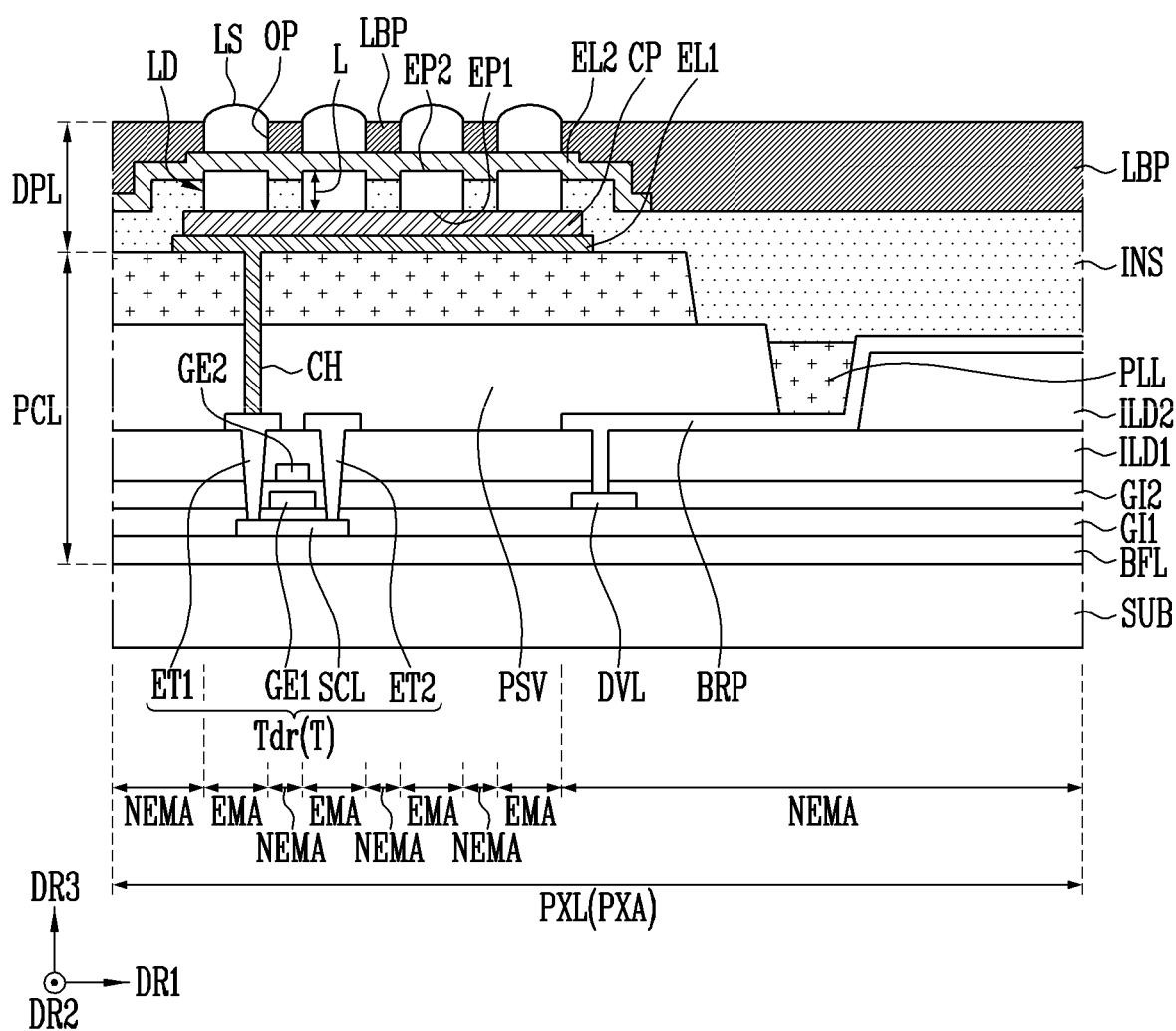
FIG. 11 is a schematic cross-sectional view of a pixel according to another embodiment of the present disclosure.

FIG. 11 is a schematic cross-sectional view of a pixel PXL according to another embodiment of the present disclosure.

The pixel PXL shown in FIG. 11 may have substantially the configuration equal to or similar to the pixel PXL of FIG. 6A except that optical patterns LS are formed within the openings OP of the light blocking pattern LBP, respectively.

Accordingly, differences from the above-described embodiment will be mainly described in order to avoid redundant descriptions in relation to the pixel PXL of FIG. 11. For example, portions that are not specifically described of an embodiment may correspond to described portions of one or more other embodiments. The same numbers denote the same constituent elements, and the similar numbers denote similar constituent elements.

Referring to FIG. 11, the pixel PXL according to an embodiment may include a substrate SUB, a pixel circuit layer PCL, and a display element layer DPL.

The display element layer DPL may include a first electrode EL1, a plurality of light emitting elements LD bonded to a conductive pattern CP, an insulating layer INS, a second electrode EL2, a light blocking pattern LBP, and a plurality of optical patterns LS.

The optical patterns LS may be formed within the openings OP of the light blocking pattern LBP. For example, each of the optical patterns LS may be formed in one opening OP of the light blocking pattern LBP. In one embodiment, the number of optical patterns LS and the number of openings OP may be the same, but the present disclosure is not limited thereto.

Each of the optical patterns LS may be disposed on the second electrode EL2 on the light emitting elements LD within the corresponding opening OP of the light blocking pattern LBP. In one embodiment, each of the optical patterns LS may be a lens. The optical patterns LS may have a convex shape in the direction of the length L of the light emitting elements LD (or the third direction DR3), but the present disclosure is not limited thereto. According to the described embodiment, the optical patterns LS may have a concave shape in the direction of the length L of the light emitting elements LD (or the third direction DR3). When the optical patterns LS have the above-described shape, light emitted from the light emitting elements LD to be incident on the optical patterns LS and light reflected by the first electrode EU to be incident on the optical patterns LS may be diffused and/or scattered in various directions or may be condensed in a specific direction. By changing the shape of the above-described optical patterns LS, a degree of diffusion and/or scattering and condensing of light emitted from the light emitting elements LD may be controlled.

In one embodiment, the optical patterns LS may include a negative photosensitive material. The negative photosensitive material may be, for example, a negative transparent photosensitive resin. The optical patterns LS may be formed using light emitted from the light emitting elements LD. For example, after coating the negative photosensitive material entirely on the second electrode EL2 exposed to the outside by the light blocking pattern LBP through the openings OP, the light emitting elements LD may be driven by transferring signals (or voltages) to (or between) the first end EP1 and the second end EP2 of each of the light emitting elements LD. After exposing the negative photosensitive material with the light emitted by the light emitting elements LD, a development process may be formed, so that a portion on which the light is not incident, for example, a portion not corresponding to the light emitting elements LD among the negative photosensitive materials is removed, thereby forming a plurality of optical patterns LS on the second electrode EL2 on the light emitting elements LD. In this case, each light emitting element LD may emit blue light, and a wavelength of light emitted from each light emitting element LD may be similar to a wavelength of light used in an exposure process during a general photolithography process.

According to the above-described embodiment, because the optical patterns LS are formed only on the light emitting elements LD using light emitted from the light emitting elements LD, the light emitting elements LD and the optical patterns LS formed thereon may be accurately aligned. In this case, misalignment between constituent elements that may occur when forming the optical patterns LS on the light emitting elements LD using an external mask and an external light source (e.g., a light source used in the exposure process) may be reduced or minimized.

In addition, according to the above-described embodiment, because the optical patterns LS are accurately disposed on the light emitting elements LD, the light emitted from the light emitting elements LD may be diffused and/or scattered, condensed, refracted, and reflected in various directions (or angles), thereby increasing the amount (or intensity) of light proceeding in the image display direction of the display device ("DD" in FIG. 1). Accordingly, the emission efficiency of the pixel PXL may be further improved.

Figure 12:
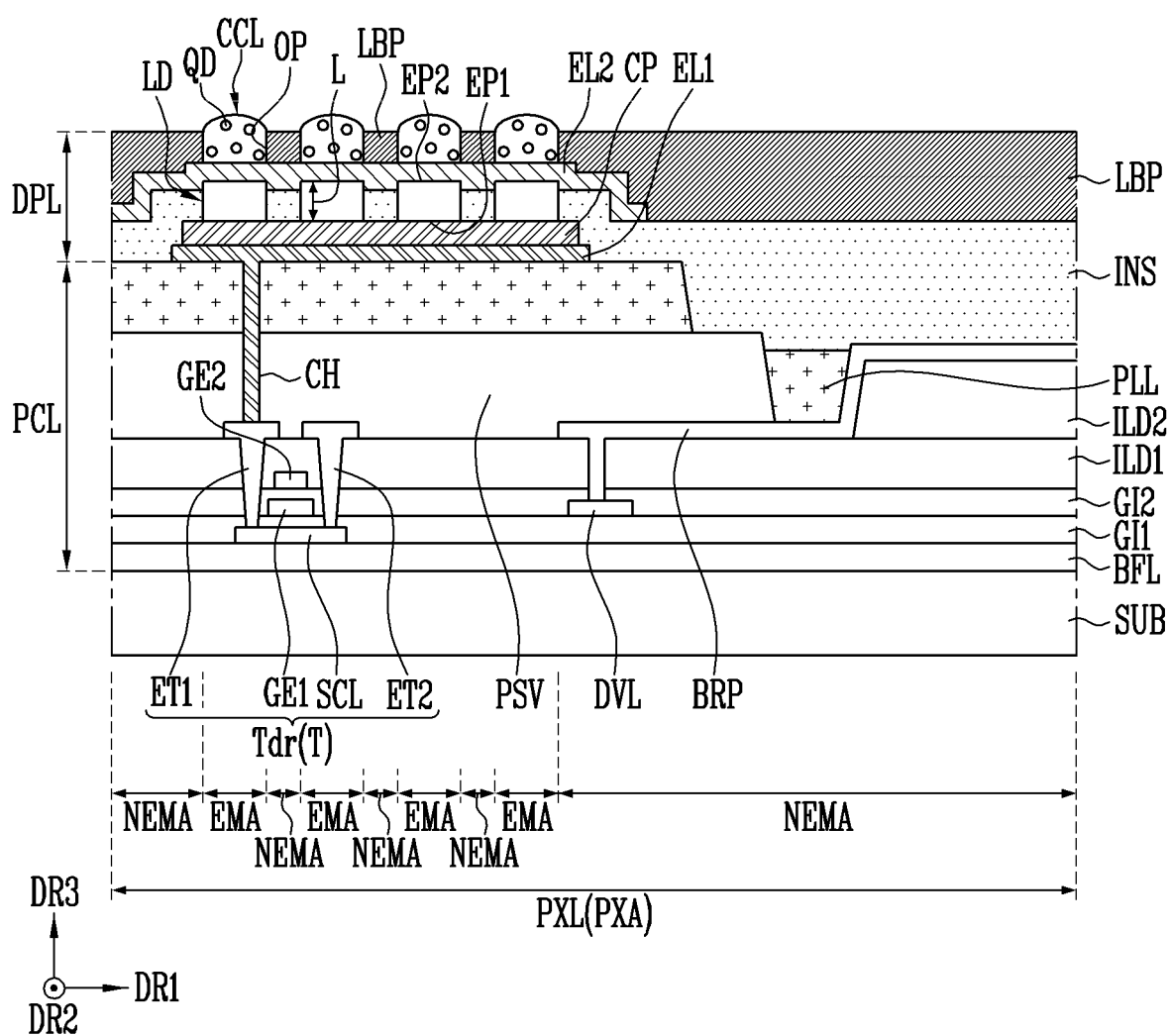
FIGS. 12 and 13 are cross-sectional views schematically illustrating a pixel according to another embodiment of the present disclosure.
Figure 13:
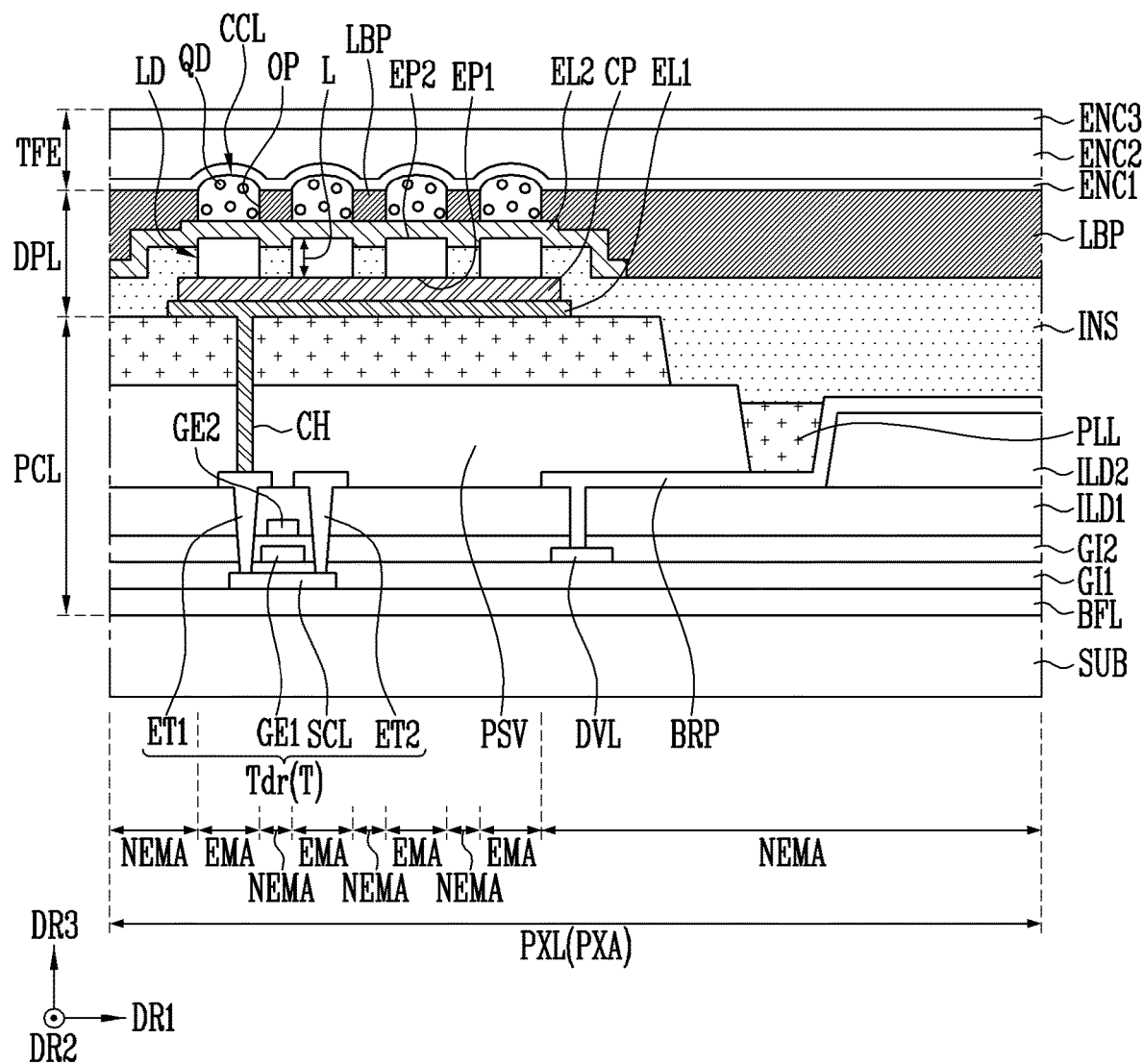

FIGS. 12 and 13 are cross-sectional views schematically illustrating a pixel PXL according to another embodiment of the present disclosure.

The pixel PXL shown in FIG. 12 may have the configuration substantially equal to or similar to the pixel PXL of FIG. 6A except that a color conversion pattern CCL is disposed within the openings OP of the light blocking pattern LBP.

The pixel PXL shown in FIG. 13 may have the configuration substantially equal to or similar to the pixel PXL of FIG. 12 except that a thin film encapsulation layer TFE is disposed on the color conversion pattern CCL.

Accordingly, in order to avoid redundant descriptions with respect to the pixel PXL of FIGS. 12 and 13, differences from the above-described embodiments will be mainly described. For example, portions that are not specifically described of an embodiment may correspond to described portions of one or more other embodiments. The same numbers denote the same constituent elements, and the similar numbers denote similar constituent elements.

Referring to FIGS. 12 and 13, the pixel PXL may include a substrate SUB, a pixel circuit layer PCL, and a display element layer DPL.

The display element layer DPL may include a first electrode EL1, a plurality of light emitting elements LD bonded to a conductive pattern CP, an insulating layer INS, a second electrode EL2, a light blocking pattern LBP, and a plurality of color conversion patterns CCL.

The color conversion patterns CCL may be formed within the openings OP of the light blocking pattern LBP. For example, the color conversion patterns CCL may be formed within one opening OP of the light blocking pattern LBP. In one embodiment, the number of color conversion patterns CCL and the number of openings OP of the light blocking pattern LBP may be the same, but the present disclosure is not limited thereto. Each of the color conversion patterns CCL may be disposed on the second electrode EL2 on the light emitting elements LD within the corresponding opening OP of the light blocking pattern LBP.

In one embodiment, the color conversion pattern CCL may include color conversion particles QD that convert light emitted from light emitting elements LD disposed in the pixel area PXA of one pixel PXL into light of a specific color. For example, when one pixel PXL is a red pixel (or a red sub-pixel), the color conversion pattern CCL may include color conversion particles QD of red quantum dots that convert light emitted from the light emitting elements LD into red light. For another example, when one pixel PXL is a green pixel (or a green sub-pixel), the color conversion pattern CCL may include color conversion particles QD of green quantum dots that convert light emitted from the light emitting elements LD into green light. For another example, when one pixel PXL is a blue pixel (or a blue sub-pixel), the color conversion pattern CCL may include color conversion particles QD of blue quantum dots that convert light emitted from the light emitting elements LD into blue light. According to the described embodiment, when one pixel PXL is a blue pixel (or a blue sub-pixel), a light scattering layer including light scattering particles may be provided instead of the color conversion pattern CCL including the color conversion particles QD. For example, when the light emitting elements LD emit blue light, one pixel PXL may include a light scattering layer including light scattering particles. The above-described light scattering layer may be omitted according to some embodiments. According to another embodiment, when one pixel PXL is a blue pixel (or a blue sub-pixel), a transparent polymer may be provided instead of the color conversion pattern CCL.

In one embodiment, the color conversion patterns CCL may include the negative photosensitive material and color conversion particles QD dispersed in the negative photosensitive material. The color conversion patterns CCL may be formed using light emitted from the light emitting elements LD. For example, after coating the negative photosensitive material in which color conversion particles are dispersed entirely on the second electrode EL2 exposed to the outside by the light blocking pattern LBP and the openings OP, the light emitting elements LD may be driven by transferring signals (or voltages) to (or between) the first end EP1 and the second end EP2 of each of the light emitting elements LD. After exposing the negative photosensitive material with the light emitted by the light emitting elements LD, a development process may be formed, so that a portion on which the light is not incident, for example, a portion corresponding to the light emitting elements LD among the negative photosensitive materials is removed, thereby forming a plurality of color conversion pattern CCL on the second electrode EL2 on the light emitting elements LD. In this case, each light emitting element LD may emit blue light, and a wavelength of light emitted from each light emitting element LD may be similar to a wavelength of light used in an exposure process during a general photolithography process.

According to the described embodiment, a thin film encapsulation layer TFE may be disposed on the color conversion patterns CCL as shown in FIG. 13. The thin film encapsulation layer TFE may cover the color conversion patterns CCL and the light emitting elements LD to protect the color conversion patterns CCL and the light emitting elements LD from external oxygen and moisture.

The thin film encapsulation layer (TFE) may be formed of a single layer, but may be formed of multiple layers. The thin film encapsulation layer TFE may include a plurality of insulating layers covering the light emitting elements LD and the color conversion patterns CCL. In detail, the thin film encapsulation layer TFE may include at least one inorganic layer and at least one organic layer. For example, the thin-film encapsulation layer TFE may have a structure in which the inorganic layer and the organic layer are alternately stacked. According to the described embodiment, the thin film encapsulation layer TFE may be an encapsulation substrate disposed on the light emitting element LD and the color conversion patterns CCL and bonded to the substrate SUB through a sealant.

The thin film encapsulation layer TFE may include first to third encapsulation layers ENC1 to ENC3. The first encapsulation layer ENC1 may be entirely formed on the color conversion patterns CCL and the light blocking pattern LBP. The second encapsulation layer ENC2 may be provided and/or formed on the first encapsulation layer ENC1. The third encapsulation layer ENC3 may be provided and/or formed on the second encapsulation layer ENC2. In one embodiment, the first and third encapsulation layers ENC1 and ENC3 may be formed of an inorganic layer including an inorganic material, and the second encapsulation layer ENC2 may be formed of an organic layer including an organic material.

According to the above-described embodiment, because the color conversion patterns CCL are formed only on the light emitting elements LD using light emitted from the light emitting elements LD, the light emitting elements LD and the color conversion patterns CCL formed thereon may be accurately aligned. In this case, misalignment between constituent elements that may occur when forming the color conversion patterns CCL on the light emitting elements LD using an external mask and an external light source (e.g., a light source used in the exposure process) may be reduced or minimized.

In addition, according to the above-described embodiment, because the color conversion patterns CCL are accurately disposed on the light emitting elements LD, light having excellent color reproducibility can be emitted in the image display direction of the display device (refer to 'DD' of FIG. 1) through the color conversion patterns CCL, thereby further improving the emission efficiency of the pixel PXL.

Figure 14:
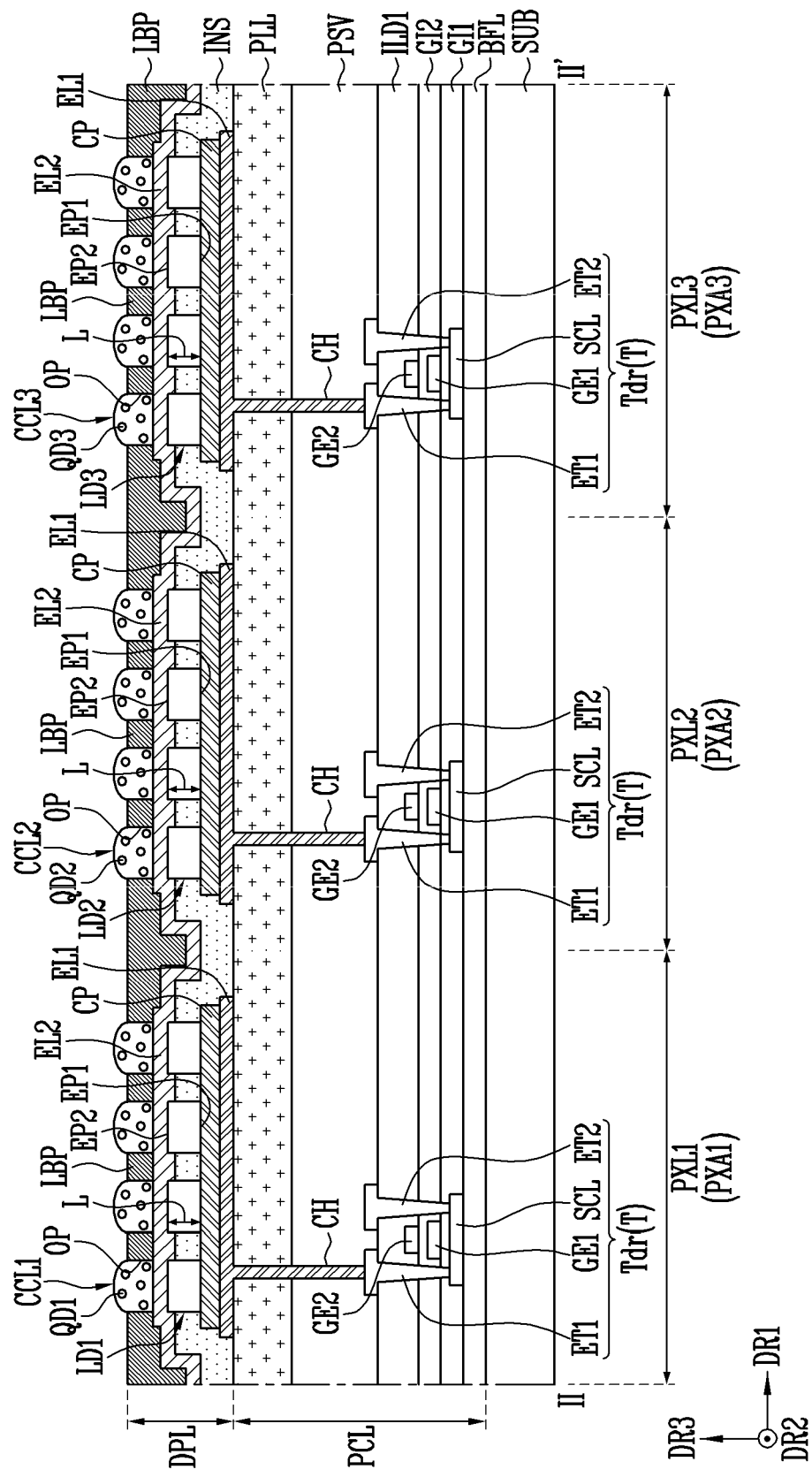
FIG. 14 is a cross-sectional view taken along the line II-II' in FIG. 3.

FIG. 14 is a cross-sectional view taken along the line II-II' in FIG. 3.

In order to avoid redundant descriptions with respect to the first to third pixels PXL1 to PXL3 of FIG. 14, differences from the above-described embodiment will be mainly described. For example, portions that are not specifically described of an embodiment may correspond to described portions of one or more other embodiments. The same numbers denote the same constituent elements, and the similar numbers denote similar constituent elements.

In FIG. 14, for convenience of descriptions, only some of constituent elements included in each of the first to third pixels PXL1 to PXL3 are illustrated.

Referring to FIGS. 3 and 14, a first pixel PXL1 (or a first sub-pixel), a second pixel PXL2 (or a second sub-pixel), and a third pixel PXL3 (or a third sub-pixel) may be arranged along the first direction DR1. Each of the first to third pixels PXL1, PXL2, and PXL3 may have the same configuration as each of the pixels PXL described with reference to FIG. 3.

The display area DA of the substrate SUB may include a first pixel area PXA1 in which the first pixel PXL1 is provided, a second pixel area PXA2 in which the second pixel PXL2 is provided, and a third pixel area PXA3 in which a third pixel PLX3 is provided. In one embodiment, the first pixel PXL1 may be a red pixel, the second pixel PXL2 may be a green pixel, and the third pixel PXL3 may be a blue pixel. However, the present disclosure is not limited thereto, and according to one embodiment, the second pixel PXL2 may be a red pixel, the first pixel PXL1 may be a green pixel, and the third pixel PXL3 may be a blue pixel. Further, according to another embodiment, the third pixel PXL3 may be a red pixel, the first pixel PXL1 may be a green pixel, and the second pixel PXL2 may be a blue pixel.

Each of the first to third pixels PXL1 to PXL3 may include a substrate SUB, a pixel circuit layer PCL, and a display element layer DPL.

The display element layer DPL of the first pixel PXL1 may include a first electrode EL1, a plurality of first light emitting elements LD1 bonded to a conductive pattern CP, an insulating layer INS, a second electrode EL2, a light blocking pattern LBP, and a plurality of first color conversion patterns CCL1. Here, each of the first light emitting elements LD1 may be a light emitting element LD described with reference to FIGS. 7 and 8.

The first color conversion patterns CCL1 may be formed within the openings OP of the light blocking pattern LBP in the first pixel PXL1. For example, each of the first color conversion patterns CCL1 may be formed within one opening OP of the light blocking pattern LBP in the first pixel area PXA1. In one embodiment, the number of the first color conversion patterns CCL1 and the number of the openings OP of the light blocking pattern LBP disposed in the first pixel area PXA1 may be the same, but the present disclosure is not limited thereto. Each of the first color conversion patterns CCL1 may be disposed on the second electrode EL2 on one first light emitting element LD1 within a corresponding opening OP of the light blocking pattern LBP in the first pixel area PXA1.

Each of the first color conversion patterns CCL1 may include a negative photosensitive material and first color conversion particles QD1 that are dispersed in the negative photosensitive material and convert light emitted from the first light emitting elements LD1 into light of a specific color. For example, when each of the first light emitting elements LD1 emits blue light, each of the first color conversion patterns CCL1 may include the first color conversion particles QD1 that convert the blue light into red light. Here, the first color conversion particles QD1 may be red quantum dots.

According to the described embodiment, when each of the first light emitting elements LD1 emits red light, the display element layer DPL of the first pixel PXL1 may include the optical patterns LS described with reference to FIG. 11 instead of the first color conversion patterns CCL1. Here, the optical patterns LS may be lenses for diffusing and/or scattering, condensing, refracting, and reflecting red light emitted from the first light emitting elements LD1 in various directions.

The display element layer DPL of the second pixel PXL2 may include a first electrode EL1, a plurality of second light emitting elements LD2 bonded to a conductive pattern CP, an insulating layer INS, a second electrode EL2, a light blocking pattern LBP, and a plurality of second color conversion patterns CCL2. Here, each of the second light emitting elements LD2 may be a light emitting element LD described with reference to FIGS. 7 and 8.

The second color conversion patterns CCL2 may be formed within the openings OP of the light blocking pattern LBP. For example, each of the second color conversion patterns CCL2 may be formed within one opening OP of the light blocking pattern LBP in the second pixel area PXA2. In one embodiment, the number of the second color conversion patterns CCL2 and the number of the openings OP of the light blocking pattern LBP disposed in the second pixel area PXA2 may be the same, but the present disclosure is not limited thereto. Each of the second color conversion patterns CCL2 may be disposed on the second electrode EL2 on one second light emitting element LD2 within a corresponding opening OP of the light blocking pattern LBP in the second pixel area PXA2.

Each of the second color conversion patterns CCL2 may include the negative photosensitive material and second color conversion particles QD2 that are dispersed in the negative photosensitive material and convert light emitted from the second light emitting elements LD2 into light of a specific color. For example, when each of the second light emitting elements LD2 emits blue light, the second color conversion patterns CCL2 may include second color conversion particles QD2 that convert the blue light into green light. Here, the second color conversion particles QD2 may be green quantum dots.

According to the described embodiment, when each of the second light emitting elements LD2 emits green light, the display element layer DPL of the second pixel PXL2 may include the optical patterns LS described with reference to FIG. 11 instead of the second color conversion patterns CCL2. Here, the optical patterns LS may be lenses for diffusing and/or scattering, condensing, refracting, and reflecting green light emitted from the second light emitting elements LD2 in various directions.

The display element layer DPL of the third pixel PXL3 may include a first electrode EL1, a plurality of third light emitting elements LD3 bonded to a conductive pattern CP, an insulating layer INS, a second electrode EL2, a light blocking pattern LBP, and a plurality of third color conversion patterns CCL3. Here, each of the third light emitting elements LD3 may be a light emitting element LD described with reference to FIGS. 7 and 8.

The third color conversion patterns CCL3 may be formed within the openings OP of the light blocking pattern LBP. For example, each of the third color conversion patterns CCL3 may be formed within one opening OP of the light blocking pattern LBP in the third pixel area PXA3. In one embodiment, the number of the third color conversion patterns CCL3 and the number of the openings OP of the light blocking pattern LBP disposed in the third pixel area PXA3 may be the same, but the present disclosure is not limited thereto. Each of the third color conversion patterns CCL3 may be disposed on the second electrode EL2 on one third light emitting element LD3 in a corresponding opening OP of the light blocking pattern LBP in the third pixel area PXA3.

Each of the third color conversion patterns CCL3 may include a negative photosensitive material and third color conversion particles QD3 that are dispersed in the negative photosensitive material and convert light emitted from the third light emitting elements LD3 into light of a specific color. For example, when each of the third light emitting elements LD3 emits blue light, the third color conversion patterns CCL3 may include the third color conversion particles QD3 that emit the blue light as it is or convert it to blue light in a desired wavelength range. Here, the third color conversion particles QD3 may be light scattering particles or blue quantum dots.

According to the described embodiment, when each of the third light emitting elements LD3 emits blue light, the display element layer DPL of the third pixel PXL3 may include the optical patterns LS described with reference to FIG. 11 instead of the third color conversion patterns CCL3. Here, the optical patterns LS may be lenses for diffusing and/or scattering, condensing, refracting, and reflecting blue light emitted from the third light emitting elements LD3 in various directions.

According to the described embodiment, the thin film encapsulation layer TFE described with reference to FIG. 13 may be disposed on the first to third color conversion patterns CCL1 to CCL3.

While the present disclosure has been shown and described with reference to certain embodiments thereof, it will be understood by those skilled in the art that various changes in forms and details may be made therein without departing from the spirit and scope of the present disclosure as defined by the appended claims and their equivalents.

Accordingly, the technical scope of the present disclosure may be determined by the technical scope of the accompanying claims and their equivalents.

What is claimed is:
1. A display device comprising:
a substrate including a plurality of pixel areas; and
a pixel in each of the plurality of pixel areas,
wherein the pixel comprises:
  a pixel circuit layer on the substrate and comprising at least one transistor;
  a first electrode on the pixel circuit layer and electrically connected to the transistor;
  a plurality of light emitting elements on the first electrode and electrically connected to the first electrode;
  a second electrode on the plurality of light emitting elements; and
  a light blocking pattern on the second electrode and including a plurality of openings corresponding to each of the plurality of light emitting elements, and
wherein each of the plurality of pixel areas includes an emission area corresponding to each of the plurality of openings and a non-emission area excluding the emission area.

2. The display device of claim 1, wherein each of the plurality of light emitting elements comprises a first end and a second end in a length direction, and wherein the first end is at a lower end of the plurality of light emitting elements in the length direction, and the second end is at an upper end of the plurality of light emitting elements in the length direction.

3. The display device of claim 2, wherein each of the plurality of light emitting elements comprises:
a first semiconductor layer electrically connected to the first electrode;
a second semiconductor layer contacting the second electrode and electrically connected to the second electrode; and
an active layer between the first semiconductor layer and the second semiconductor layer,
wherein the first semiconductor layer comprises a p-type semiconductor layer doped with a p-type dopant, and the second semiconductor layer comprises an n-type semiconductor layer doped with an n-type dopant, and
wherein the first semiconductor layer is at the first end, and the second semiconductor layer is at the second end.

4. The display device of claim 3, wherein the first end of each of the plurality of light emitting elements and the second end of each of the plurality of light emitting elements have different sizes in one direction crossing the length direction.

5. The display device of claim 4, wherein the second end of each of the plurality of light emitting elements has a size larger in the one direction than the first end of each of the plurality of light emitting elements.

6. The display device of claim 5, wherein each of the plurality of light emitting elements further comprises:
an insulating film surrounding an outer peripheral surface of each of the first semiconductor layer, the active layer, and the second semiconductor layer; and
a reflective member surrounding an outer peripheral surface of the insulating film.

7. The display device of claim 6, wherein the reflective member has a height shorter than a length of each of the plurality of light emitting elements in the length direction.

8. The display device of claim 7, wherein the reflective member partially surrounds the outer peripheral surface of the insulating film and exposes a portion of the insulating film to the outside.

9. The display device of claim 8, wherein the light blocking pattern comprises a positive photosensitive material and a plurality of light blocking patterns spaced from each other by the plurality of openings.

10. The display device of claim 9, wherein the plurality of light blocking patterns between the plurality of openings have a constant width in the one direction.

11. The display device of claim 9, wherein the plurality of light blocking patterns between the plurality of openings have a width that increases in the one direction toward the second electrode.

12. The display device of claim 9, further comprising a plurality of optical patterns within the plurality of openings and corresponding to each of the plurality of light emitting elements.

13. The display device of claim 12, wherein the plurality of optical patterns comprises a negative transparent photosensitive material.

14. The display device of claim 9, further comprising
a plurality of color conversion patterns within the plurality of openings, corresponding to each of the plurality of light emitting elements, and comprising color conversion particles.

15. The display device of claim 14, wherein:
the plurality of color conversion patterns comprises a negative photosensitive material, and
the color conversion particles are dispersed in the negative photosensitive material.

16. The display device of claim 15, further comprising a thin film encapsulation layer on the plurality of color conversion patterns.

17. The display device of claim 3, further comprising a conductive pattern between the first electrode and the first end of each of the plurality of light emitting elements.

18. The display device of claim 17, wherein the conductive pattern comprises a bonding metal to reflect light emitted from the plurality of light emitting elements to an upper direction of the plurality of light emitting elements and couples the plurality of light emitting elements and the first electrode.

* * * * *